(12) United States Patent
Wright

(10) Patent No.: US 8,278,978 B1
(45) Date of Patent: Oct. 2, 2012

(54) PROGRAMMABLE VOLTAGE REGULATOR

(75) Inventor: David G. Wright, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/283,570

(22) Filed: Oct. 27, 2011

Related U.S. Application Data

(63) Continuation of application No. 11/973,038, filed on Oct. 4, 2007, now Pat. No. 8,072,247.

(60) Provisional application No. 60/906,605, filed on Mar. 12, 2007.

(51) Int. Cl.
*H03L 7/00* (2006.01)

(52) U.S. Cl. ......................... 327/143; 327/198

(58) Field of Classification Search .................. 327/142, 327/143, 198
See application file for complete search history.

(56) References Cited

U.S. PATENT DOCUMENTS

| | | | |
|---|---|---|---|
| 4,668,932 A * | 5/1987 | Drori et al. ....................... 338/48 |
| 4,727,514 A | 2/1988 | Bhuva et al. | |
| 4,734,885 A | 3/1988 | Luich | |
| 4,810,948 A * | 3/1989 | Takuma ........................ 323/280 |
| 5,006,974 A | 4/1991 | Kazerounian et al. | |
| 5,014,097 A | 5/1991 | Kazerounian et al. | |
| 5,086,508 A * | 2/1992 | Furuno ............................ 455/69 |
| 5,163,146 A | 11/1992 | Antanaitis, Jr. et al. | |
| 5,168,463 A | 12/1992 | Ikeda et al. | |
| 5,336,951 A | 8/1994 | Josephson et al. | |
| 5,336,986 A | 8/1994 | Allman | |
| 5,369,703 A | 11/1994 | Archibald et al. | |
| 5,376,834 A * | 12/1994 | Carobolante ................. 327/143 |
| 5,418,969 A | 5/1995 | Matsuzaki et al. | |
| 5,444,412 A | 8/1995 | Kowalski | |
| 5,481,549 A | 1/1996 | Tokuyama | |
| 5,546,568 A | 8/1996 | Bland et al. | |
| 5,568,083 A | 10/1996 | Uchiyama et al. | |
| 5,594,442 A | 1/1997 | Paulos et al. | |
| 5,629,635 A | 5/1997 | Reno | |
| 5,661,685 A | 8/1997 | Lee et al. | |
| 5,664,205 A | 9/1997 | O'Brien et al. | |
| 5,693,570 A | 12/1997 | Cernea et al. | |
| 5,699,063 A * | 12/1997 | Takayama ..................... 341/118 |
| 5,726,995 A | 3/1998 | Wong | |
| 5,744,944 A | 4/1998 | Danstrom | |
| 5,748,684 A | 5/1998 | Sanchez | |
| 5,838,950 A | 11/1998 | Young et al. | |
| 5,877,719 A | 3/1999 | Matsui et al. | |

(Continued)

FOREIGN PATENT DOCUMENTS

EP         0619548 A1    10/1994

OTHER PUBLICATIONS

U.S. Appl. No. 60/906,605: "Programmable Intelligent Integrated Circuits," David G. Wright, filed Mar. 12, 2007; 16 pages.

(Continued)

*Primary Examiner* — Lincoln Donovan
*Assistant Examiner* — William Hernandez

(57) ABSTRACT

A circuit in accordance with one embodiment of the invention can include a variable voltage generator that is coupled to receive an input voltage. Furthermore, the circuit can include a non-volatile memory that is coupled to the variable voltage generator. The non-volatile memory can be coupled to receive programming for controlling an output voltage of the variable voltage generator.

20 Claims, 12 Drawing Sheets

U.S. PATENT DOCUMENTS

| Patent | Date | Inventor | Ref |
|---|---|---|---|
| 5,878,234 A | 3/1999 | Dutkiewicz et al. | |
| 5,925,110 A | 7/1999 | Klein | |
| 6,038,400 A | 3/2000 | Bell et al. | |
| 6,105,155 A | 8/2000 | Cheng et al. | |
| 6,177,785 B1 | 1/2001 | Lee | |
| 6,182,163 B1 | 1/2001 | Yamashita et al. | |
| 6,191,614 B1 | 2/2001 | Schultz et al. | |
| 6,195,712 B1 | 2/2001 | Pawlowski et al. | |
| 6,229,352 B1 | 5/2001 | Chevallier et al. | |
| 6,253,268 B1 | 6/2001 | Bjorkengren et al. | |
| 6,256,240 B1 | 7/2001 | Shinozaki | |
| 6,260,139 B1 | 7/2001 | Alfke | |
| 6,281,716 B1 | 8/2001 | Mihara | |
| 6,298,448 B1 | 10/2001 | Shaffer et al. | |
| 6,320,809 B1 | 11/2001 | Raad | |
| 6,321,282 B1 * | 11/2001 | Horowitz et al. | 710/104 |
| 6,330,231 B1 | 12/2001 | Bi | |
| 6,366,224 B2 | 4/2002 | Cliff et al. | |
| RE37,708 E | 5/2002 | Danstrom | |
| 6,400,605 B1 | 6/2002 | Adkins | |
| 6,429,682 B1 | 8/2002 | Schultz et al. | |
| 6,499,123 B1 | 12/2002 | Mcfarland et al. | |
| 6,509,845 B1 | 1/2003 | Tanaka | |
| 6,570,428 B1 * | 5/2003 | Liao et al. | 327/291 |
| 6,577,157 B1 | 6/2003 | Cheung et al. | |
| 6,577,175 B2 | 6/2003 | Kim et al. | |
| 6,603,280 B2 * | 8/2003 | Notohara et al. | 318/500 |
| 6,683,481 B1 | 1/2004 | Zhou et al. | |
| 6,697,292 B1 * | 2/2004 | Fukuda | 365/201 |
| 6,798,254 B2 | 9/2004 | Marshall et al. | |
| 6,854,067 B1 | 2/2005 | Kutz et al. | |
| 6,865,113 B2 | 3/2005 | Voicu et al. | |
| 6,912,605 B1 | 6/2005 | Wright | |
| 6,912,606 B2 | 6/2005 | Fay | |
| 6,924,790 B1 | 8/2005 | Bi | |
| 6,999,342 B2 | 2/2006 | Ooishi | |
| 7,012,558 B1 * | 3/2006 | Arimura et al. | 341/155 |
| 7,023,458 B2 * | 4/2006 | Kudo et al. | 345/690 |
| 7,030,668 B1 | 4/2006 | Edwards | |
| 7,071,664 B1 | 7/2006 | Teggatz et al. | |
| 7,089,133 B1 | 8/2006 | Williams et al. | |
| 7,089,434 B2 | 8/2006 | Kuo | |
| 7,096,137 B2 | 8/2006 | Shipton et al. | |
| 7,107,178 B2 | 9/2006 | Won et al. | |
| 7,142,009 B1 | 11/2006 | Watt et al. | |
| 7,174,144 B2 | 2/2007 | Lin | |
| 7,176,726 B2 | 2/2007 | Bock | |
| 7,221,200 B1 | 5/2007 | Kotra et al. | |
| 7,224,801 B2 | 5/2007 | Abdo et al. | |
| 7,228,476 B2 | 6/2007 | Scipioni et al. | |
| 7,269,780 B2 | 9/2007 | Arima et al. | |
| 7,304,923 B2 | 12/2007 | Sano et al. | |
| 7,310,757 B2 | 12/2007 | Ngo et al. | |
| 7,315,158 B1 * | 1/2008 | Matsui | 323/283 |
| 7,345,944 B1 | 3/2008 | Jenkins, IV | |
| 7,382,676 B2 | 6/2008 | Ballweber et al. | |
| 7,385,418 B2 | 6/2008 | Speers et al. | |
| 7,392,409 B2 | 6/2008 | Tateyama | |
| 7,392,447 B2 | 6/2008 | Tang et al. | |
| 7,403,051 B1 | 7/2008 | Lesea | |
| 7,415,624 B2 | 8/2008 | Miller et al. | |
| 7,415,647 B2 | 8/2008 | Yee | |
| 7,421,291 B2 | 9/2008 | Karaoguz et al. | |
| 7,424,553 B1 | 9/2008 | Borrelli et al. | |
| 7,439,782 B2 | 10/2008 | Kamoshida | |
| 7,449,926 B2 | 11/2008 | Sakai et al. | |
| 7,453,295 B2 | 11/2008 | Hotaka | |
| 7,496,692 B2 | 2/2009 | Holm et al. | |
| 7,508,242 B2 | 3/2009 | Tokuno | |
| 7,532,056 B2 | 5/2009 | Seo | |
| 7,579,895 B2 | 8/2009 | Sun et al. | |
| 7,589,584 B2 | 9/2009 | Bui | |
| 7,619,402 B1 | 11/2009 | Kwong | |
| 7,626,576 B2 | 12/2009 | Anandakumar et al. | |
| 7,672,258 B1 | 3/2010 | Wu et al. | |
| 7,673,194 B1 | 3/2010 | Sun et al. | |
| 7,679,411 B2 | 3/2010 | Sakai et al. | |
| 7,679,964 B2 | 3/2010 | Lee | |
| 7,710,939 B2 | 5/2010 | Shao et al. | |
| 7,739,529 B2 | 6/2010 | Hardman et al. | |
| 7,760,655 B2 | 7/2010 | Wilhelm | |
| 7,795,893 B2 | 9/2010 | Agatsuma | |
| 7,802,212 B2 | 9/2010 | Best et al. | |
| 7,844,308 B2 | 11/2010 | Rhee et al. | |
| 7,929,716 B2 * | 4/2011 | Niwa et al. | 381/113 |
| 8,058,910 B1 | 11/2011 | Wright | |
| 8,058,911 B1 | 11/2011 | Wright | |
| 8,060,767 B1 | 11/2011 | Wright | |
| 8,072,247 B1 | 12/2011 | Wright | |
| 8,089,306 B1 | 1/2012 | Wright | |
| 2002/0080967 A1 | 6/2002 | Abdo et al. | |
| 2002/0108011 A1 | 8/2002 | Tanha | |
| 2003/0031320 A1 | 2/2003 | Fan et al. | |
| 2003/0074364 A1 | 4/2003 | Sewall et al. | |
| 2003/0093751 A1 | 5/2003 | Hohl | |
| 2003/0103405 A1 | 6/2003 | Mano et al. | |
| 2003/0120922 A1 | 6/2003 | Sun et al. | |
| 2004/0029621 A1 | 2/2004 | Karaoguz et al. | |
| 2004/0088630 A1 | 5/2004 | Arima et al. | |
| 2004/0218762 A1 | 11/2004 | Le Saint et al. | |
| 2005/0052437 A1 | 3/2005 | Hudson | |
| 2005/0071730 A1 | 3/2005 | Moyer et al. | |
| 2005/0074051 A1 | 4/2005 | Won et al. | |
| 2005/0093572 A1 | 5/2005 | Sun et al. | |
| 2005/0093582 A1 | 5/2005 | Bock | |
| 2005/0195664 A1 | 9/2005 | Ooishi | |
| 2005/0243059 A1 | 11/2005 | Morris et al. | |
| 2006/0035590 A1 | 2/2006 | Morris et al. | |
| 2006/0095802 A1 | 5/2006 | Dhong et al. | |
| 2006/0117230 A1 | 6/2006 | Scipioni et al. | |
| 2006/0125760 A1 * | 6/2006 | Jee et al. | 345/98 |
| 2006/0212838 A1 | 9/2006 | Carson et al. | |
| 2006/0227082 A1 * | 10/2006 | Ogata et al. | 345/76 |
| 2006/0236147 A1 | 10/2006 | Best et al. | |
| 2007/0094420 A1 | 4/2007 | Holm et al. | |
| 2007/0147381 A1 | 6/2007 | Wilhelm | |
| 2007/0183205 A1 | 8/2007 | Lee | |
| 2007/0263872 A1 | 11/2007 | Kirkup et al. | |
| 2008/0071972 A1 | 3/2008 | Kimura | |
| 2008/0074361 A1 * | 3/2008 | Lee et al. | 345/77 |
| 2008/0086626 A1 | 4/2008 | Jones et al. | |
| 2008/0106309 A1 | 5/2008 | Abe | |
| 2009/0167093 A1 | 7/2009 | Nguyen et al. | |
| 2009/0285344 A1 * | 11/2009 | Boerstler et al. | 375/376 |
| 2009/0315582 A1 | 12/2009 | Agatsuma | |

OTHER PUBLICATIONS

USPTO Notice of Allowance for U.S. Appl. No. 12/005,775 dated Sep. 7, 2010; 6 pages.

USPTO Notice of Allowance for U.S. Appl. No. 12/005,775 dated Dec. 17, 2010; 6 pages.

USPTO Notice of Allowance for U.S. Appl. No. 12/005,950 dated June 27, 2011; 5 pages.

USPTO Notice of Allowance for U.S. Appl. No. 13/167,006 dated Feb. 16, 2012; 7 pages.

USPTO Notice of Allowance for U.S. Appl. No. 13/167,006 dated Mar. 20, 2012; 7 pages.

USPTO Notice of Allowance for U.S. Appl. No. 13/182,264 dated Apr. 11, 2012; 7 pages.

USPTO Notice of Allowance for U.S. Appl. No. 13/182,264 dated May 15, 2012; 7 pages.

USPTO Notice of Allowance for U.S. Appl. No. 13/182,264 dated June 14, 2012; 7 pages.

USPTO Notice of Allowance, U.S. Appl. No. 13/182,295, dated Apr. 27, 2012, 16 pages.

USPTO Requirement for Restriction for U.S. Appl. No. 12/005,768 dated May 11, 2009; 6 pages.

USPTO Requirement for Restriction for U.S. Appl. No. 13/182,295 dated Nov. 30, 2011; 6 pages.

USPTO Requirement for Restriction/Election for U.S. Appl. No. 11/691,676 dated Aug. 1, 2008; 6 pages.

Wong et al., "Flexible Test Mode Design for DRAM Characterization," 1996 Symposium on VLSI Circuits Digest of Technical Papers, vol., No., pp. 194-195, Jun. 13-15, 1996, doi: 10.1109/VLSIC.1996.507768; 2 pages.

U.S. Appl. No. 11/691,676: "Interface Circuit and Method for Programming or Communicating with an Integrated Circuit via a Power Supply Pin," David G. Wright, filed Mar. 27, 2007; 44 pages.
U.S. Appl. No. 11/904,643: "Integrity Checking of Configurable Data of Programmable Device," David G. Wright, filed Sep. 28, 2007; 34 pages.
U.S. Appl. No. 11/904,644: "Configuration of Programmable Device using a DMA Controller," David G. Wright, filed Sep. 28, 2007; 34 pages.
U.S. Appl. No. 11/973,090: "Intelligent Voltage Regulator," David G. Wright, filed Oct. 4, 2007; 51 pages.
U.S. Appl. No. 12/005,743: "Acquiring a Mode of an Integrated Circuit," David G. Wright, filed Dec. 27, 2007; 33 pages.
U.S. Appl. No. 12/005,748: "Firmware Memory of an Integrated Circuit," David G. Wright, filed Dec. 28, 2007; 31 pages.
U.S. Appl. No. 12/005,768: "Intelligent Power Supervisor," David G. Wright, filed Dec. 27, 2007; 43 pages.
U.S. Appl. No. 12/005,774: "Intelligent Serial Interface," David G. Wright, filed Dec. 28, 2007; 30 pages.
U.S. Appl. No. 12/005,775: "Programmable Power Supervisor," David G. Wright, filed Dec. 27, 2007; 42 pages.
U.S. Appl. No. 12/005,950: "Ultra Low Power Sleep Mode," David G. Wright, filed Dec. 28, 2007; 30.
U.S. Appl. No. 12/075,632: "Interrupt Latency Reduction," David G. Wright, filed Mar. 12, 2008; 31 pages.
U.S. Appl. No. 12/075,633: "Encoded Acknowledge Signal for Wireless Communication," David G. Wright, filed Mar. 12, 2008; 28 pages.
U.S. Appl. No. 12/075,748: "Secure Wireless Transmission," David G. Wright, filed Mar. 12, 2008; 25 pages.
U.S. Appl. No. 13/167,006: "Intelligent Voltage Regulator," David Wright, filed Jun. 23, 2011; 55 pages.
U.S. Appl. No. 13/182,264: "Programmable Power Supervisor," David G. Wright, filed Jul. 13, 2011; 42 pages.
U.S. Appl. No. 13/182,295: "Intelligent Power Supervisor," David G. Wright, filed Jul. 13, 2011; 49 pages.
U.S. Appl. No. 13/466,004: "Intelligent Voltage Regulator," David G. Wright, filed May 7, 2012; 51 pages.
Baldoni et al., "Properties of Communication Modes in Distributed Systems," Algorithms and Architectures for Parallel Processing, 1995, ICAPP 95, IEEE First ICA/sup 3/PP., IEEE First International Conference on, vol. 2, No., pp. 501-504, vol. 2, Apr. 19-21, 1995, doi: 10.1109/ICAPP.1995.472232; 4 pages.
National Semiconductor, "54150/DM54150/DM741150, 54151A/DM54151A/DM74151A Data Selectors/Multiplexers," Datasheet, Jun. 1989, Downloaded from <www.DatasheetCatalog.com>, pp. 1-10; 11 pages.
The Authoritative Dictionary of IEEE Standard Terms, Seventh Edition, 2000, (selected definitions) ISBN 0738126012; 6 pages.
USPTO Advisory Action for U.S. Appl. No. 11/691,676 dated Aug. 5, 2009; 3 pages.
USPTO Advisory Action for U.S. Appl. No. 11/904,644 dated Mar. 28, 2011; 2 pages.
USPTO Advisory Action for U.S. Appl. No. 11/904,644 dated Jul. 16, 2010; 3 pages.
USPTO Advisory Action for U.S. Appl. No. 11/973,090 dated May 20, 2010; 2 pages.
USPTO Advisory Action for U.S. Appl. No. 12/075,632 dated Feb 4, 2011; 3 pages.
USPTO Advisory Action for U.S. Appl. No. 12/075,632 dated Apr. 19, 2010; 3 pages.
USPTO Final Rejection for U.S. Appl. No. 11/691,676 dated Feb. 26, 2010; 11 pages.
USPTO Final Rejection for U.S. Appl. No. 11/691,676 dated May 27, 2009; 10 pages.
USPTO Final Rejection for U.S. Appl. No. 11/904,644 dated Jan. 21, 2011; 7 pages.
USPTO Final Rejection for U.S. Appl. No. 11/904,644 dated Apr. 28, 2010; 7 pages.
USPTO Final Rejection for U.S. Appl. No. 11/973,038 dated Mar. 25, 2010; 5 pages.
USPTO Final Rejection for U.S. Appl. No. 11/973,038 dated Oct. 13, 2010; 5 pages.
USPTO Final Rejection for U.S. Appl. No. 11/973,090 dated Mar. 9, 2010; 7 pages.
USPTO Final Rejection for U.S. Appl. No. 12/005,748 dated Jun. 27, 2011; 15 pages.
USPTO Final Rejection for U.S. Appl. No. 12/005,748 dated Sep. 24, 2010; 15 pages.
USPTO Final Rejection for U.S. Appl. No. 12/005,774 dated Feb. 8, 2011; 12 pages.
USPTO Final Rejection for U.S. Appl. No. 12/005,774 dated Mar. 23, 2010; 14 pages.
USPTO Final Rejection for U.S. Appl. No. 12/075,632 dated Nov. 26, 2010; 10 pages.
USPTO Final Rejection for U.S. Appl. No. 12/075,632 dated Feb. 3, 2010; 9 pages.
USPTO Final Rejection for U.S. Appl. No. 12/075,633 dated Nov. 24, 2010; 13 pages.
USPTO Final Rejection for U.S. Appl. No. 13/167,006 dated Dec. 7, 2011; 6 pages.
USPTO Non-Final Rejection for U.S. Appl. No. 11/691,676 dated Oct. 20, 2009; 11 pages.
USPTO Non-Final Rejection for U.S. Appl. No. 11/691,676 dated Nov. 28, 2008; 8 pages.
USPTO Non-Final Rejection for U.S. Appl. No. 11/904,643 dated Apr. 3, 2009; 9 pages.
USPTO Non-Final Rejection for U.S. Appl. No. 11/904,644 dated Jun. 24, 2011; 7 pages.
USPTO Non-Final Rejection for U.S. Appl. No. 11/904,644 dated Aug. 9, 2010; 7 pages.
USPTO Non-Final Rejection for U.S. Appl. No. 11/904,644 dated Oct. 28, 2009; 6 pages.
USPTO Non-Final Rejection for U.S. Appl. No. 11/973,038 dated Jul. 1, 2010; 5 pages.
USPTO Non-Final Rejection for U.S. Appl. No. 11/973,038 dated Oct. 23, 2009; 5 pages.
USPTO Non-Final Rejection for U.S. Appl. No. 11/973,090 dated Jun. 22, 2010; 7 pages.
USPTO Non-Final Rejection for U.S. Appl. No. 11/973,090 dated Sep. 21, 2009; 7 pages.
USPTO Non-Final Rejection for U.S. Appl. No. 12/005,743 dated Jun. 7, 2010; 11 pages.
USPTO Non-Final Rejection for U.S. Appl. No. 12/005,748 dated Mar. 18, 2011; 13 pages.
USPTO Non-Final Rejection for U.S. Appl. No. 12/005,748 dated May 11, 2010; 14 pages.
USPTO Non-Final Rejection for U.S. Appl. No. 12/005,768 dated Feb. 16, 2010; 8 pages.
USPTO Non-Final Rejection for U.S. Appl. No. 12/005,768 dated Aug. 20, 2009; 7 pages.
USPTO Non-Final Rejection for U.S. Appl. No. 12/005,768 dated Oct. 1, 2010; 7 pages.
USPTO Non-Final Rejection for U.S. Appl. No. 12/005,774 dated Oct. 27, 2010; 14 pages.
USPTO Non-Final Rejection for U.S. Appl. No. 12/005,774 dated Sep. 15, 2009; 12 pages.
USPTO Non-Final Rejection for U.S. Appl. No. 12/005,775 dated Feb. 11, 2009; 5 pages.
USPTO Non-Final Rejection for U.S. Appl. No. 12/005,775 dated Sep. 22, 2009; 4 pages.
USPTO Non-Final Rejection for U.S. Appl. No. 12/005,950 dated Feb. 17, 2011; 9 pages.
USPTO Non-Final Rejection for U.S. Appl. No. 12/005,950 dated Sep. 13, 2010; 8 pages.
USPTO Non-Final Rejection for U.S. Appl. No. 12/075,632 dated May 25, 2010; 9 pages.
USPTO Non-Final Rejection for U.S. Appl. No. 12/075,632 dated Jun. 24, 2009; 6 pages.
USPTO Non-Final Rejection for U.S. Appl. No. 12/075,633 dated Feb. 22, 2011; 12 pages.
USPTO Non-Final Rejection for U.S. Appl. No. 12/075,633 dated Apr. 26, 2010; 11 pages.
USPTO Non-Final Rejection for U.S. Appl. No. 12/075,748 dated Jun. 7, 2011; 10 pages.

USPTO Non-Final Rejection for U.S. Appl. No. 13/167,006 dated Jul. 20, 2011; 9 pages.
USPTO Non-Final Rejection for U.S. Appl. No. 13/182,264 dated Dec. 30, 2011; 8 pages.
USPTO Non-Final Rejection for U.S. Appl. No. 13/182,295 dated Feb. 6, 2012; 9 pages.
USPTO Non-Final Rejection for U.S. Appl. No. 13/283,570 dated Jan. 4, 2012; 9 pages.
USPTO Notice of Allowance for U.S. Appl. No. 11/691,676 dated Mar. 15, 2011; 7 pages.
USPTO Notice of Allowance for U.S. Appl. No. 11/691,676 dated Jun. 24, 2011; 8 pages.
USPTO Notice of Allowance for U.S. Appl. No. 11/691,676 dated Nov. 29, 2010; 7 pages.
USPTO Notice of Allowance for U.S. Appl. No. 11/691,676 dated Jun. 24, 2010; 10 pages.
USPTO Notice of Allowance for U.S. Appl. No. 11/904,643 dated Jan. 12, 2011; 7 pages.
USPTO Notice of Allowance for U.S. Appl. No. 11/904,643 dated May 3, 2011; 9 pages.
USPTO Notice of Allowance for U.S. Appl. No. 11/904,643 dated Jun. 11, 2010; 8 pages.
USPTO Notice of Allowance for U.S. Appl. No. 11/904,643 dated Sep. 28, 2010; 8 pages.
USPTO Notice of Allowance for U.S. Appl. No. 11/904,643 dated Nov. 3, 2009; 7 pages.
USPTO Notice of Allowance for U.S. Appl. No. 11/904,643 dated Feb. 26, 2010; 8 pages.
USPTO Notice of Allowance for U.S. Appl. No. 11/973,038 dated Jan. 6, 2011; 6 pages.
USPTO Notice of Allowance for U.S. Appl. No. 11/973,038 dated Apr. 11, 2011; 7 pages.
USPTO Notice of Allowance for U.S. Appl. No. 11/973,038 dated Jul. 15, 2011; 7 pages.
USPTO Notice of Allowance for U.S. Appl. No. 11/973,090 dated Jan. 10, 2011; 6 pages.
USPTO Notice of Allowance for U.S. Appl. No. 11/973,090 dated Apr. 18, 2011; 7 pages.
USPTO Notice of Allowance for U.S. Appl. No. 11/973,090 dated Aug. 4, 2011; 7 pages.
USPTO Notice of Allowance for U.S. Appl. No. 11/973,090 dated Sep. 30, 2010; 6 pages.
USPTO Notice of Allowance for U.S. Appl. No. 12/005,768 dated Feb. 17, 2011; 7 pages.
USPTO Notice of Allowance for U.S. Appl. No. 12/005,768 dated Jun. 28, 2010; 6 pages.
USPTO Notice of Allowance for U.S. Appl. No. 12/005,768 dated Sep. 23, 2011; 8 pages.
USPTO Notice of Allowance for U.S. Appl. No. 12/005,775 dated Feb. 12, 2010; 6 pages.
USPTO Notice of Allowance for U.S. Appl. No. 12/005,775 dated Mar. 24, 2011; 7 pages.
USPTO Notice of Allowance for U.S. Appl. No. 12/005,775 dated May 27, 2010; 6 pages.
USPTO Notice of Allowance for U.S. Appl. No. 12/005,775 dated Jun. 19, 2009; 6 pages.
USPTO Notice of Allowance for U.S. Appl. No. 12/005,775 dated Jul. 8, 2011; 7 pages.

* cited by examiner

PROGRAMMABLE VOLTAGE REGULATOR

CROSS-REFERENCE TO RELATED APPLICATIONS

The present application is a continuation of U.S. patent application Ser. No. 11/973,038, entitled "Programmable Voltage Regulator" By David G. Wright, filed on Oct. 4, 2007, which claims the priority benefits of U.S. Provisional Application No. 60/906,605, filed Mar. 12, 2007, each of which is incorporated in its entirety by reference herein.

The present patent application is related to co-pending U.S. patent application Ser. No. 12/005,775, entitled "Programmable Power Supervisor" by David G. Wright, filed on Dec. 27, 2007, which is hereby incorporated by reference.

The present patent application is related to co-pending U.S. patent application Ser. No. 12/005,768, entitled "Intelligent Power Supervisor" by David G. Wright, filed on Dec. 27, 2007, which is hereby incorporated by reference.

The present patent application is related to co-pending U.S. patent application Ser. No. 11/973,090, entitled "Intelligent Voltage Regulator" by David G. Wright, filed on Oct. 4, 2007, which is hereby incorporated by reference.

The present patent application is related to co-pending U.S. patent application Ser. No. 11/691,676, entitled "Interface Circuit and Method for Programming or Communicating with an Integrated Circuit via a Power Supply Pin" by David G. Wright, filed on Mar. 27, 2007, which is hereby incorporated by reference.

BACKGROUND

A conventional linear voltage regulator produces a constant rated output voltage once its input voltage supply exceeds a specified threshold voltage. However below that threshold voltage, the output of the linear voltage regulator may fall below the constant rated voltage. Furthermore, a conventional linear voltage regulator is rated based on its established output voltage when manufactured. Given this situation, conventionally suppliers of linear voltage regulators maintain and sell a different linear voltage regulator for each rated output voltage. Unfortunately, this leads to inventory issues as many different linear voltage regulators are maintained, supported, and the like.

Conventionally external circuit components have been utilized to change the rated output voltage of a conventional linear voltage regulator. However, one of the disadvantageous with external circuit components is that they increase the quiescent current of the linear voltage regulator and therefore increase its power consumption.

It is noted that conventional switching voltage regulators (e.g., buck, boost, and buck-boost) also have characteristics that are established when manufactured, thus resulting in similar disadvantages described above with reference to conventional linear voltage regulators. Additionally, when external circuit components are utilized to change any characteristic of a conventional switching voltage regulator, the external circuit components produce similar disadvantages described above with reference to conventional linear voltage regulators.

As such, it is desirable to address one or more of the above issues.

SUMMARY

A circuit in accordance with one embodiment of the invention can include a variable voltage generator that is coupled to receive an input voltage. Furthermore, the circuit can include a non-volatile memory that is coupled to the variable voltage generator. The non-volatile memory can be coupled to receive programming for controlling an output voltage of the variable voltage generator.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Unless specifically stated otherwise as apparent from the following discussions, it is appreciated that throughout the present detailed description, discussions utilizing terms such as "receiving", "storing", "generating", "determining", "combining", "disabling", "performing", "translating", "setting", "programming", "utilizing", "presenting", "incorporating", "producing", "retrieving", "outputting", or the like, can refer to the actions and processes of a computer system or electronic computing device, but is not limited to such. The computer system or electronic computing device can manipulate and transform data represented as physical (electronic) quantities within the computer system's registers and/or memories into other data similarly represented as physical quantities within the computer system memories and/or registers or other such information storage, transmission, or display devices. Some embodiments of the invention are also well suited to the use of other computer systems such as, for example, optical and virtual computers.

Figure 1A:
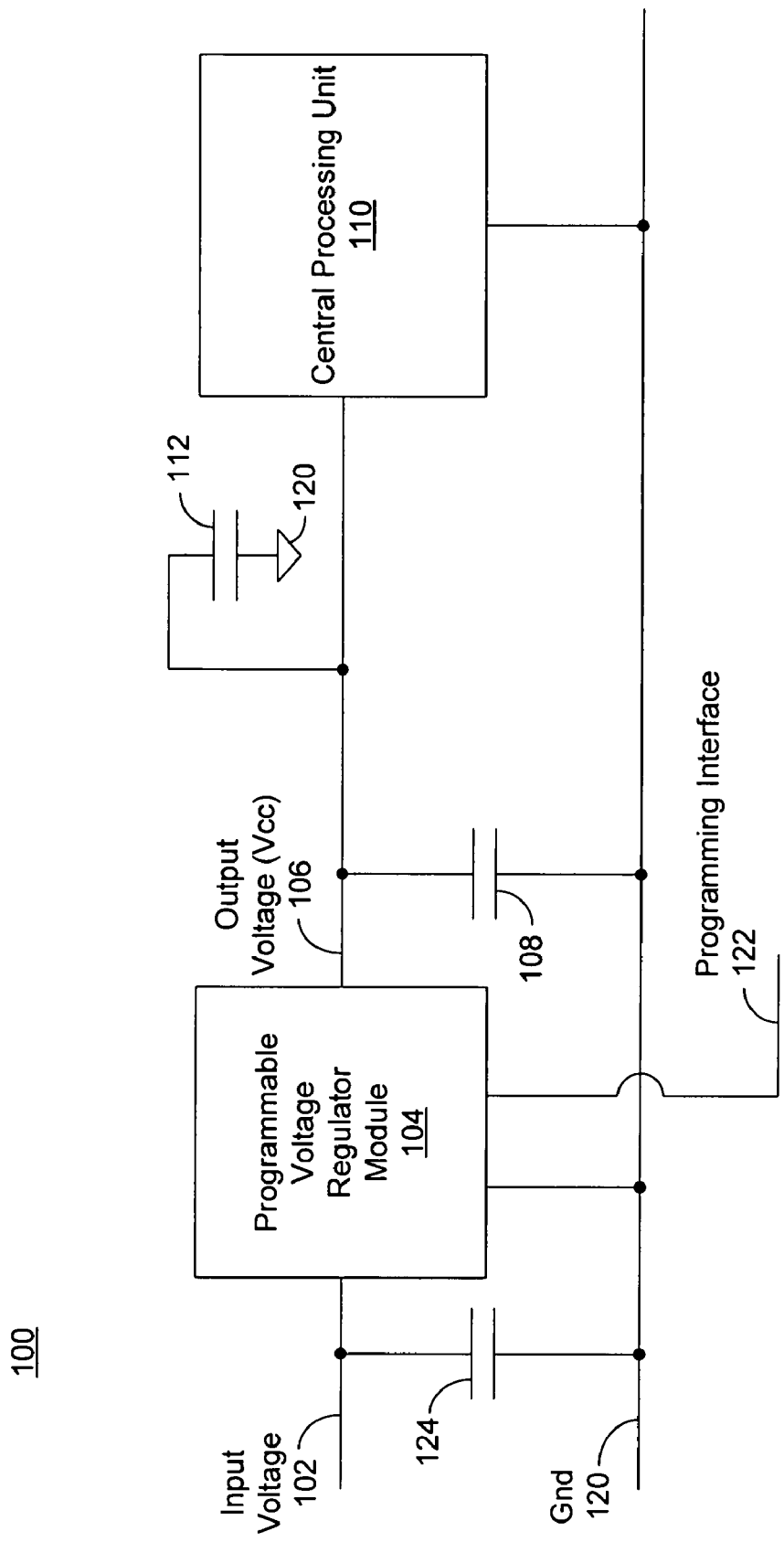
FIG. 1A is a diagram of an exemplary system in accordance with various embodiments of the invention.

FIG. 1A is a diagram of an exemplary system 100 in accordance with various embodiments of the invention. Specifically in one embodiment, the system 100 can include a programmable voltage regulator module 104. For example in an embodiment, the programmable voltage regulator module 104 can have a programmable output voltage. It is pointed out that voltage regulator 104 can offer user programmable output voltage without using external components. The programmable voltage regulator module 104 can be implemented in a wide variety of ways. For example, the programmable voltage regulator module 104 can be implemented as, but is not limited to, a programmable linear voltage regulator, a programmable switching buck voltage regulator, a programmable switching boost voltage regulator, and a programmable switching buck-boost voltage regulator. It is noted that when the programmable voltage regulator module 104 is implemented in an embodiment as a programmable switching voltage regulator (e.g., buck voltage regulator, boost voltage regulator, or buck boost voltage regulator), both the output and ripple voltages can be user programmable. Furthermore, in an embodiment, the programmable voltage regulator module 104 can be user programmable and also provide the functionality of being re-programmable. Note that the programmability may be accomplished by, but is not limited to, a user in the field thereby improving the ease of use of the programmable voltage regulator 104 along with system 100. It is pointed out that by enabling this type of programmability, a single programmable voltage regulator circuit (e.g., 104) can be maintained by a manufacturer and supplied to cover a wide range of output voltage specifications. In one embodiment, system 100 can be fabricated as a single integrated circuit (IC) chip.

Specifically, the system 100 can include a programming interface 122 that can be coupled to the programmable voltage regulator 104. As such, the programming of the programmable voltage regulator 104 can be implemented or accomplished over the programming interface 122 (e.g., a serial interface, a serial communication bus, an Inter-Integrated Circuit (I²C) communication bus, a Serial Peripheral Interface (SPI) Bus, Dallas one-wire bus, Microwire® (μWire), but is not limited to such). In an embodiment, the programmable voltage regulator module 104 can be programmed via the supply voltage 102 utilizing modulation. For example, the programmable supervisor module 104 can be programmed via its supply voltage 102 in any manner similar to that described by the co-pending U.S. patent application Ser. No. 11/691,676, entitled "Interface Circuit and Method for Programming or Communicating with an Integrated Circuit via a Power Supply Pin" by David G. Wright, filed on Mar. 27, 2007, which is hereby incorporated by reference. Once programmed, the configuration information for the programmable voltage regulator 104 may be stored by non-volatile memory, e.g., flash memory (not shown in FIG. 1A).

Within FIG. 1A, the system 100 can include the programmable voltage regulator 104, which can include an input voltage (or voltage supply) 102 and an output voltage 106. The output voltage (Vout) 106 of the programmable voltage regulator 104 can be the voltage source (Vcc) for one or more circuits and/or circuit elements. For example in the system 100, the output voltage 106 can be the voltage source for a central processing unit (CPU) 110 and capacitors 108 and 112 of system 100. Note that in one embodiment, it is desirable to hold the central processing unit 110 in a reset mode until the output voltage 106 is stable. Additionally in an embodiment, it is desirable to produce a substantially stable output voltage 106. As such, the system 100 can include a capacitor 108 that is coupled to the output voltage 106 of the programmable voltage regulator 104. Furthermore, the system 100 can also include a decoupling capacitor 112 that can be located close to the central processing unit 110 in order to decouple the output voltage 106. In one embodiment (shown in FIG. 4), the programmable voltage regulator 104 can generate a reset signal (e.g., logic "1" or zero), which can be utilized to substantially hold the central processing unit 110 in a reset mode.

The system 100 can include, but is not limited to, the programmable voltage regulator module 104, central processing unit (CPU) 110, programming interface 122, and capacitors 108, 112 and 124. Specifically, the programmable voltage regulator module 104 can include the voltage input (or supply voltage) 102 and the voltage output 106. It is pointed out that in various embodiments, the programmable voltage regulator module 104 can be implemented as a positive voltage regulator or a negative voltage regulator. As a positive programmable voltage regulator 104 in an embodiment, the input voltage 102 and output voltage 106 may be positive with respect to ground 120. As a negative programmable voltage regulator 104 in an embodiment, the input voltage 102 and output voltage 106 may be negative with respect to ground 120. The voltage output 106 of the voltage regulator can be coupled to a first terminal of the capacitor 108, a first terminal of the capacitor 112, and a first terminal of the CPU 110. Furthermore, the system 100 can include a voltage ground (Gnd) 120 having a low voltage value. The voltage ground 120 can be coupled to a third terminal of the programmable voltage regulator module 104, a second terminal of the capacitor 108, and a second terminal of the CPU 110. Additionally, the programming interface 122 can be coupled to the programmable voltage regulator module 104, which in one embodiment is digitally programmable. The voltage input 102 can be coupled to a first terminal of capacitor 124 while voltage ground 120 can be coupled to a second terminal of capacitor 124.

Within FIG. 1A, it is pointed out that the programmable voltage regulator module 104 can provide different advantages and benefits. For example, the programmable voltage regulator module 104 enables a manufacturer to fabricate and store a single device that can be programmed in an independent stage before being incorporated on a circuit board. Furthermore, the programmable voltage regulator module 104 enables one to incorporate it with automatic test equipment. As such, as part of the automatic test process, the tester equipment could actually program the programmable voltage regulator module 104.

Note that the programmable voltage regulator module 104 can be combined with other circuits and/or circuit elements. For example in one embodiment, a mixed signal microcontroller (e.g., one of the PSoC family of devices) may be used as a platform for the programmable voltage regulator module 104 and/or the system 100. It is noted that the PSoC family of devices are available from Cypress Semiconductor of San Jose, Calif. In an embodiment in accordance with the invention, non-volatile memory (not shown in FIG. 1A) can be utilized in combination with the programmable voltage regulator module 104. As such, the programmable voltage regulator module 104 can be coupled to the non-volatile memory in order to utilize it. The non-volatile memory can be implemented in a wide variety of ways. For example, the non-volatile memory can be, but is not limited to, electrically erasable programmable read only memory (EEPROM), flash memory, erasable programmable read only memory (EPROM), and the like.

In one embodiment, the programmable voltage regulator module 104 of FIG. 1A can be implemented as a stand alone voltage regulator device. It is noted that by stand alone, it can mean that in an embodiment of the programmable voltage regulator 104 it can be utilized to generate an output voltage (e.g., 106).

Within FIG. 1A, it is understood that the system 100 may not include all of the elements illustrated by FIG. 1A. Additionally, the system 100 can be implemented to include one or more elements not illustrated by FIG. 1A.

Figure 1B:
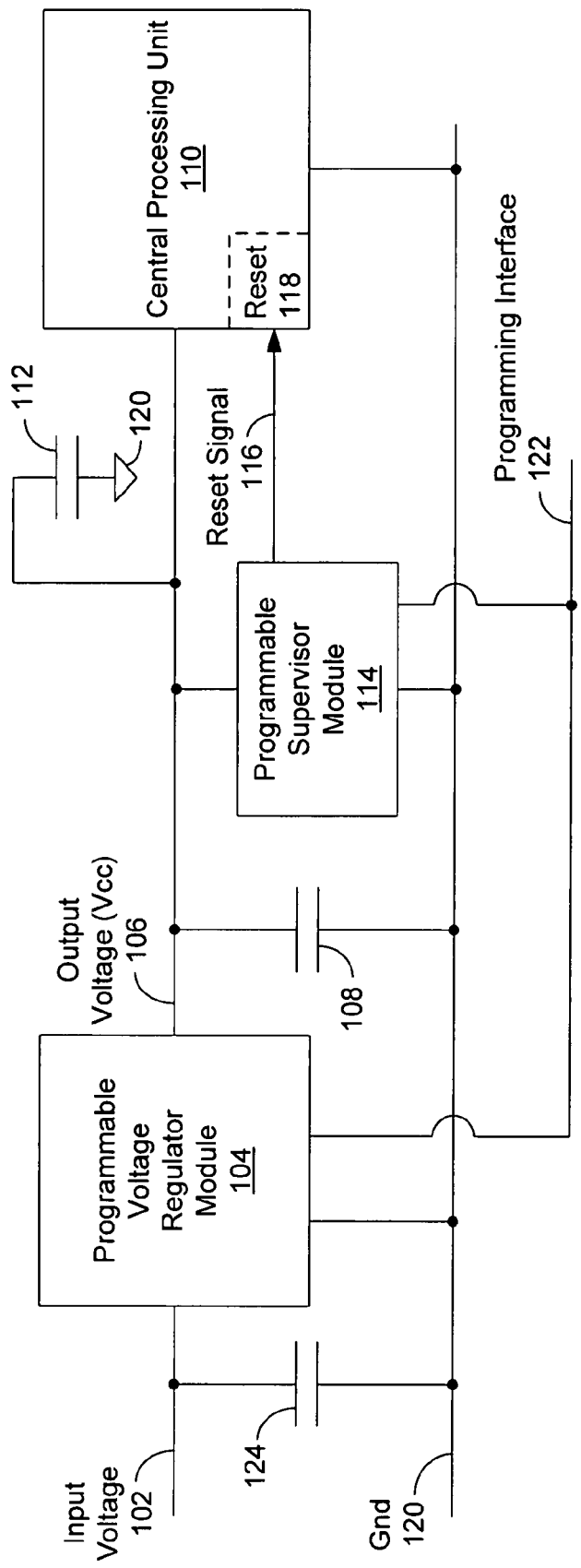
FIG. 1B is a diagram of another exemplary system in accordance with various embodiments of the invention.

FIG. 1B is a diagram of an exemplary system 150 in accordance with various embodiments of the invention. It is pointed out that the elements of FIG. 1B having the same reference numbers as the elements of any other figure can operate or function in any manner similar to that described herein, but are not limited to such.

System 150 includes the elements of system 100 along with the addition of a programmable supervisor module 114, which can function as a power-on reset (POR) circuit that is programmable. Note that the programmable supervisor module 114 can be implemented in a wide variety of ways. For example, the programmable supervisor module 114 can be implemented in any manner similar to that described by the co-pending U.S. patent application Ser. No. 12/005,775, entitled "Programmable Power Supervisor" by David G. Wright, filed on Dec. 27, 2007, which is hereby incorporated by reference. In an embodiment, the programmable voltage regulator 104 and the programmable supervisor module 114 can be combined in a single integrated circuit (IC) chip.

The system 150 can include, but is not limited to, the programmable voltage regulator module 104, programmable supervisor module 114, central processing unit (CPU) 110, programming interface 122, and capacitors 108, 112 and 124. Specifically, the voltage regulator circuit 104 can include voltage input 102 and voltage output (Vout) 106. The voltage output 106 of the programmable voltage regulator module 104 can be coupled to a first terminal of the capacitor 108, a first terminal of the programmable supervisor 114, a first terminal of the capacitor 112, and a first terminal of the CPU 110. Furthermore, the system 150 can include the voltage ground (Gnd) 120 having a low voltage value. The voltage ground 120 can be coupled to a third terminal of the programmable voltage regulator module 104, a second terminal of the capacitor 108, a second terminal of the programmable supervisor 114, and a second terminal of the CPU 110. A third terminal of the programmable supervisor 114 can be coupled to a reset input 118 of the CPU 110. As such, the programmable supervisor module 114 can output and the CPU 110 can receive a reset signal 116. Additionally, the programming interface 122 can be coupled to the programmable voltage regulator module 104 and the programmable supervisor module 114. The voltage input 102 can be coupled to a first terminal of capacitor 124 while voltage ground 120 can be coupled to a second terminal of capacitor 124.

Within FIG. 1B, it is understood that the system 150 may not include all of the elements illustrated by FIG. 1B. Additionally, the system 150 can be implemented to include one or more elements not illustrated by FIG. 1B.

With reference to FIGS. 1A and 1B, in one embodiment, it is noted that the programmable voltage regulator 104 can enable a semiconductor supplier to sell a single part that can be programmed with multiple different operating settings. Furthermore, the programmable voltage regulator 104 can enable a customer to buy a single device that can be programmed to cover a range of different operating settings. Moreover, the programmable voltage regulator 104 can enable an end product manufacturer to have one part on inventory that can be programmed to cover a range of different operating settings (e.g., output voltage, ripple voltage, reset, delay, etc.) which can reduce the amount of inventory and can reduce the risk of not being able to get supply.

Figure 2:
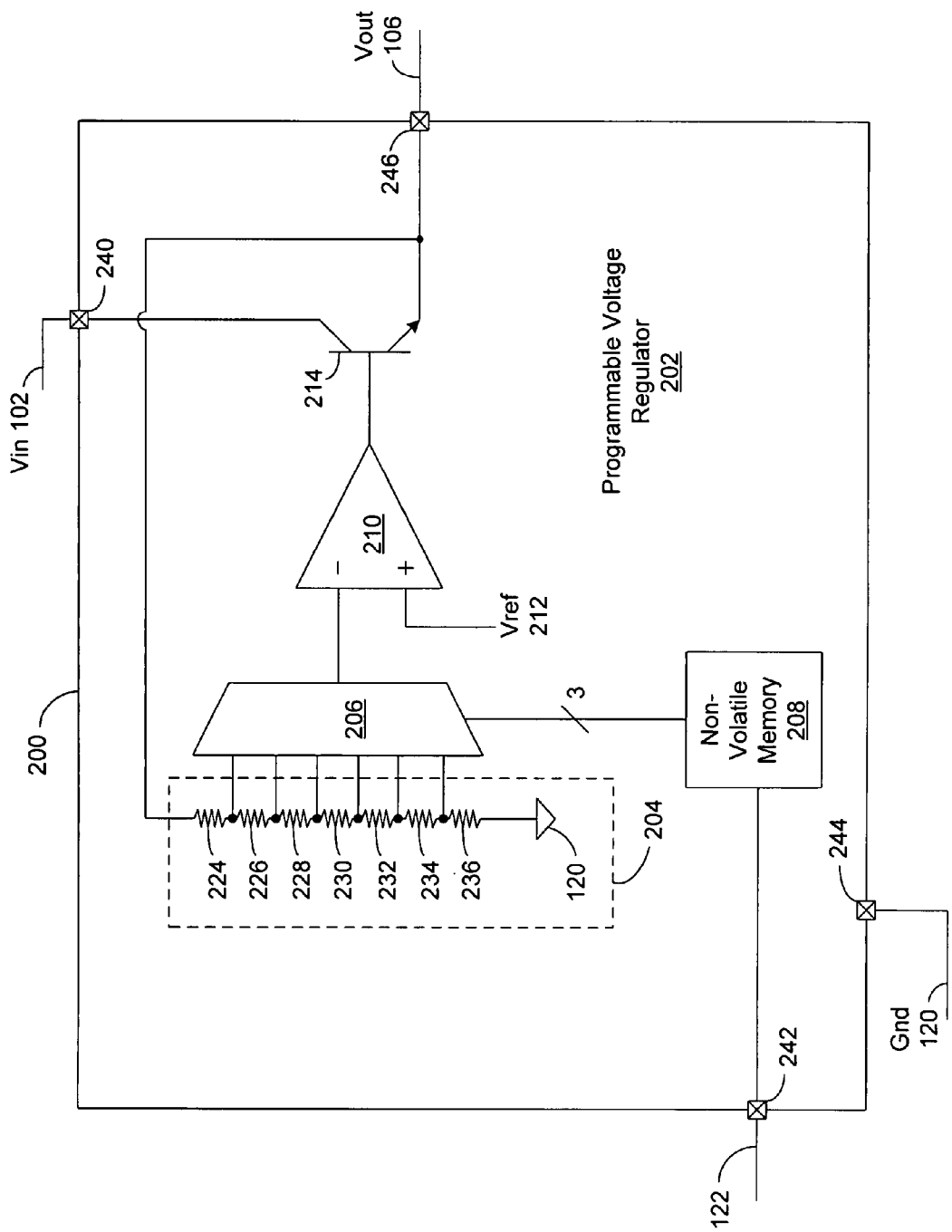
FIG. 2 is a diagram of an exemplary programmable voltage regulator circuit in accordance with various embodiments of the invention.

FIG. 2 is a schematic diagram of an exemplary programmable voltage regulator circuit 202 in accordance with various embodiments of the invention. Note that the programmable voltage regulator circuit 202 can be implemented as part of an integrated circuit 200. It is pointed out that the elements of FIG. 2 having the same reference numbers as the elements of any other figure can operate or function in any manner similar to that described herein, but are not limited to such. In an embodiment, the programmable voltage regulator circuit 202 can be an implementation of the programmable voltage regulator module 104 of FIG. 1A or FIG. 1B. The programmable voltage regulator circuit 202 of FIG. 2 can include, but is not limited to, a resistor ladder 204, a multiplexer 206, non-volatile memory 208, an operational amplifier (op-amp) 210, and a transistor 214. Additionally, the resistor ladder 204 can include multiple resistors (e.g., 224, 226, 228, 230, 232, 234 and 236) that can each have different impedance (or resistance) values, approximately the same impedance (or resistance) values, or any combination thereof. Furthermore, the resistor ladder 204 can include more or less resistors than shown in FIG. 2. Note that a programming interface 122 can be coupled to the non-volatile memory 208.

The voltage supply (Vin) 102 can be coupled to a voltage supply pin 240 of the integrated circuit 200. As such, the voltage supply 102 powers the programmable voltage regulator circuit 202 and is received by the transistor 214. The resistor ladder 204 can be coupled to the emitter of transistor 214 and an output pin 246 of the integrated circuit 200. The resistor ladder 304 can include multiple taps which can be coupled to multiple inputs of a multiplexer (MUX) 206. The output of the multiplexer 206 can be coupled to one of the inputs (e.g., negative input) of the operational amplifier 210. Additionally, the other input (e.g., positive input) of the operational amplifier 210 can be coupled to receive a reference voltage (Vref) 212. It is pointed out that in an embodiment, the combination of the resistor ladder 204, multiplexer 206, operational amplifier 210, and transistor 214 can be referred to as a variable voltage generator, but is not limited to such. Therefore, the resistor ladder 204, multiplexer 206, operational amplifier 210, and transistor 214 are one embodiment of a variable voltage generator. In one embodiment, note that the operational amplifier 210 and transistor 214 along with their couplings can be referred to as a follower circuit. In an embodiment, the follower circuit can basically be regulating the output voltage (Vout) 106 of the programmable voltage regulator circuit 202. It is pointed out that the programming interface 122 can be coupled to a programming interface pin 242 of the integrated circuit 200, which can be coupled to the non-volatile memory 208. As such, the output voltage 106 of the programmable voltage regulator circuit 202 can be programmed and stored by the non-volatile memory 208. Therefore, the non-volatile memory 208 can utilize the coupling between it and the multiplexer 206 in order to set or establish the output voltage 106 with the resistor ladder 204.

For example, if the reference voltage 212 was a bandgap voltage (e.g., 5.0 V), and there was a desire to set the output voltage at 3.0 V, then a tap in the resistor ladder 204 can be selected where the ratio divider for 5.0 V input corresponds to a 3.0 V on the potential divider. This voltage can be output by the multiplexer 206 and received by the operational amplifier 210, which can be operating in a linear region. The operational amplifier 210 can then process the voltage it receives from the multiplexer 206 and output that voltage to the base of the transistor 214. The voltage received by the base can be output from the emitter of the transistor 214 and be received by an output pin 246 of the integrated circuit 200 for outputting the output voltage 106. Furthermore, the voltage output from the emitter of the transistor 214 can be received by the resistor ladder 204. Note that the output voltage 106 of the programmable voltage regulator circuit 202 follows the reference voltage 212 (or a portion thereof) regardless of the input voltage 102. In an embodiment, it is pointed out that a gain or a programmable gain could be applied to the reference voltage 212.

Within FIG. 2, note that transistor 214 can be implemented in a wide variety of ways. For example, transistor 214 can be implemented as, but is not limited to, a NPN bipolar junction transistor (BJT) or a PNP bipolar junction transistor (BJT). Additionally, transistor 214 can be implemented as, but is not limited to, a P-channel MOSFET (metal-oxide semiconductor field-effect transistor) which is also known as a PMOS or PFET. Furthermore, transistor 214 can be implemented as, but is not limited to, an N-channel MOSFET which is also known as a NMOS or NFET. It is noted that transistor 214 can be referred to as a switching element. Note that when implemented as a BJT, an emitter, a base, and a collector of transistor 214 can each be referred to as a terminal of the transistor. Furthermore, the base of transistor 214 can also be referred to as a control terminal of the transistor. Also, when implemented as a FET, a gate, a drain, and a source of transistor 214 can each be referred to as a terminal of the transistor. Additionally, the gate of transistor 214 can also be referred to as a control terminal of the transistor.

Within FIG. 2, it is understood that the programmable voltage regulator circuit 202 may not include all of the elements illustrated by FIG. 2. Additionally, the programmable voltage regulator circuit 202 can be implemented to include one or more elements not illustrated by FIG. 2.

Figure 3:
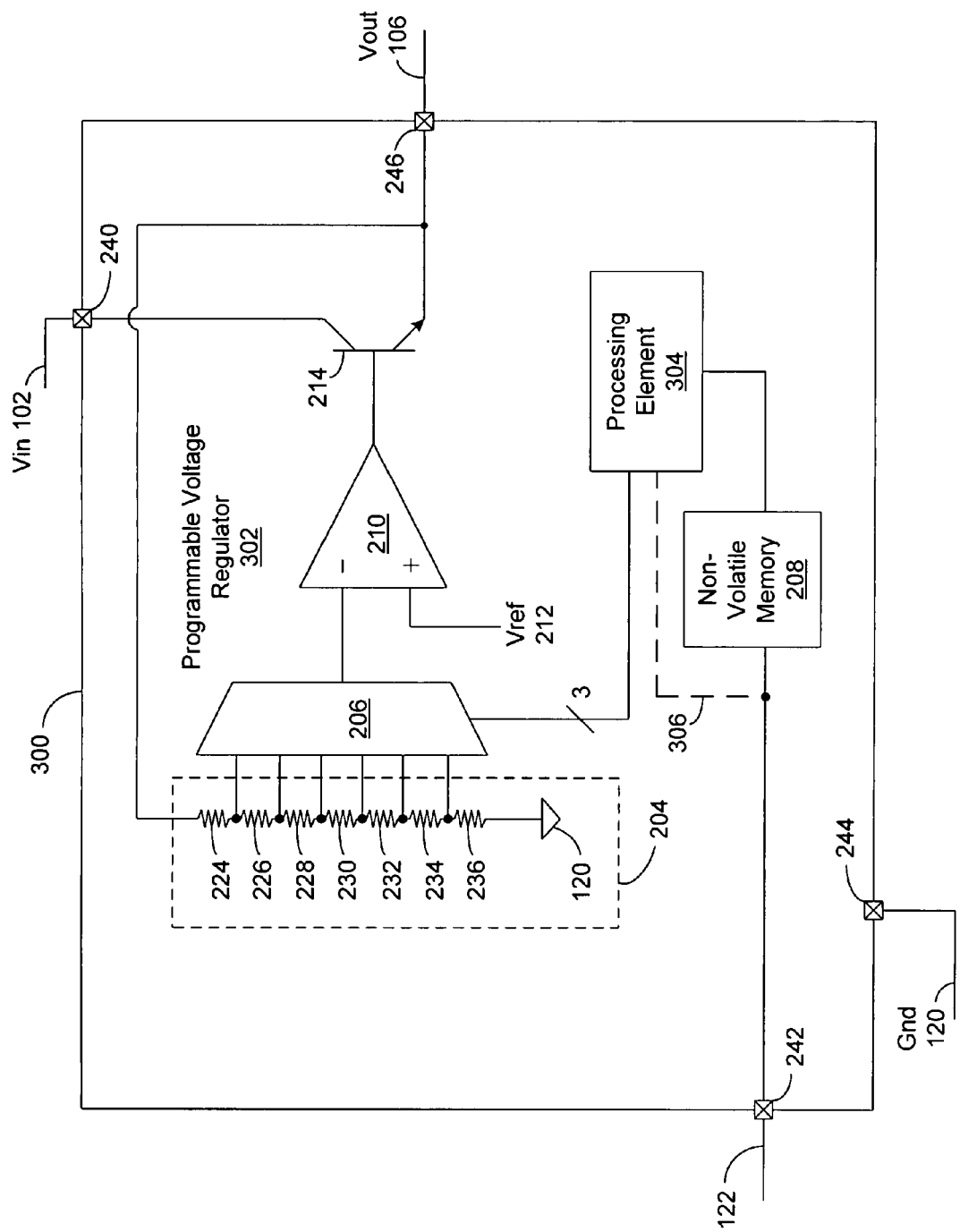
FIG. 3 is a diagram of another exemplary programmable voltage regulator circuit in accordance with various embodiments of the invention.

FIG. 3 is a schematic diagram of an exemplary programmable voltage regulator circuit 302 in accordance with various embodiments of the invention. Note that the programmable voltage regulator circuit 302 can be implemented as part of an integrated circuit 300. It is pointed out that the elements of FIG. 3 having the same reference numbers as the elements of any other figure can operate or function in any manner similar to that described herein, but are not limited to such. In an embodiment, the programmable voltage regulator circuit 302 can be an implementation of the programmable voltage regulator module 104 of FIG. 1A or FIG. 1B. The programmable voltage regulator circuit 302 of FIG. 3 can include, but is not limited to, resistor ladder 204, multiplexer 206, transistor 214, processing element 304, non-volatile memory 208, and operational amplifier 210.

Note that in one embodiment the programming interface 122 can be coupled to the non-volatile memory 208 via the programming interface pin 242. The processing element 304 can be coupled to the non-volatile memory 208 to receive any programming instructions, values and/or data stored by the non-volatile memory 208. In an embodiment, the programming interface 122 and programming interface pin 242 can be coupled to the processing element 304 as indicated by dashed line 306. It is noted that if the processing element 304 is coupled to the programming interface 122, then the processing element 304 can (in one embodiment) receive and manage the storing of any programming instructions, values and/or data within the non-volatile memory 208. In an embodiment, upon receiving programming instructions, values and/or data from the non-volatile memory 208, the processing element 304 can utilize the coupling between it and the multiplexer 206 in order to dynamically set or establish the output voltage (Vout) 106 with the resistor ladder 204. In one embodiment, upon receiving programming instructions, values and/or data from the programming interface 122, the processing element 304 can utilize the coupling between it and the multiplexer 206 in order to dynamically set or establish the output voltage 106 with the resistor ladder 204. The processing element 304 can be implemented in a wide variety of ways.

For example, the processing element 304 can include, but is not limited to, a central processing unit, a microprocessor, any type of processing element that can execute instructions, and the like.

It is pointed out that the processing element 304 can have access to the non-volatile memory 208. In an embodiment in accordance with the invention, a portion of the non-volatile memory 208 of the programmable voltage regulator circuit 302 can be reserved for one or more configuration states and another portion of the non-volatile memory 208 can be utilized for general purpose user non-volatile memory storage.

Within FIG. 3, in one embodiment in accordance with the invention, the programming interface 122 is used to program the programmable voltage regulator 302, but is not used during run time or operation of the programmable voltage regulator 302. In an embodiment, if the non-volatile memory 208 is accessible for a user's general purpose, then the programming interface 122 can be used during the run time or operation of the programmable voltage regulator 302.

It is understood that the programmable voltage regulator circuit 300 may not include all of the elements illustrated by FIG. 3. Additionally, the programmable voltage regulator circuit 300 can be implemented to include one or more elements not illustrated by FIG. 3.

Figure 4:
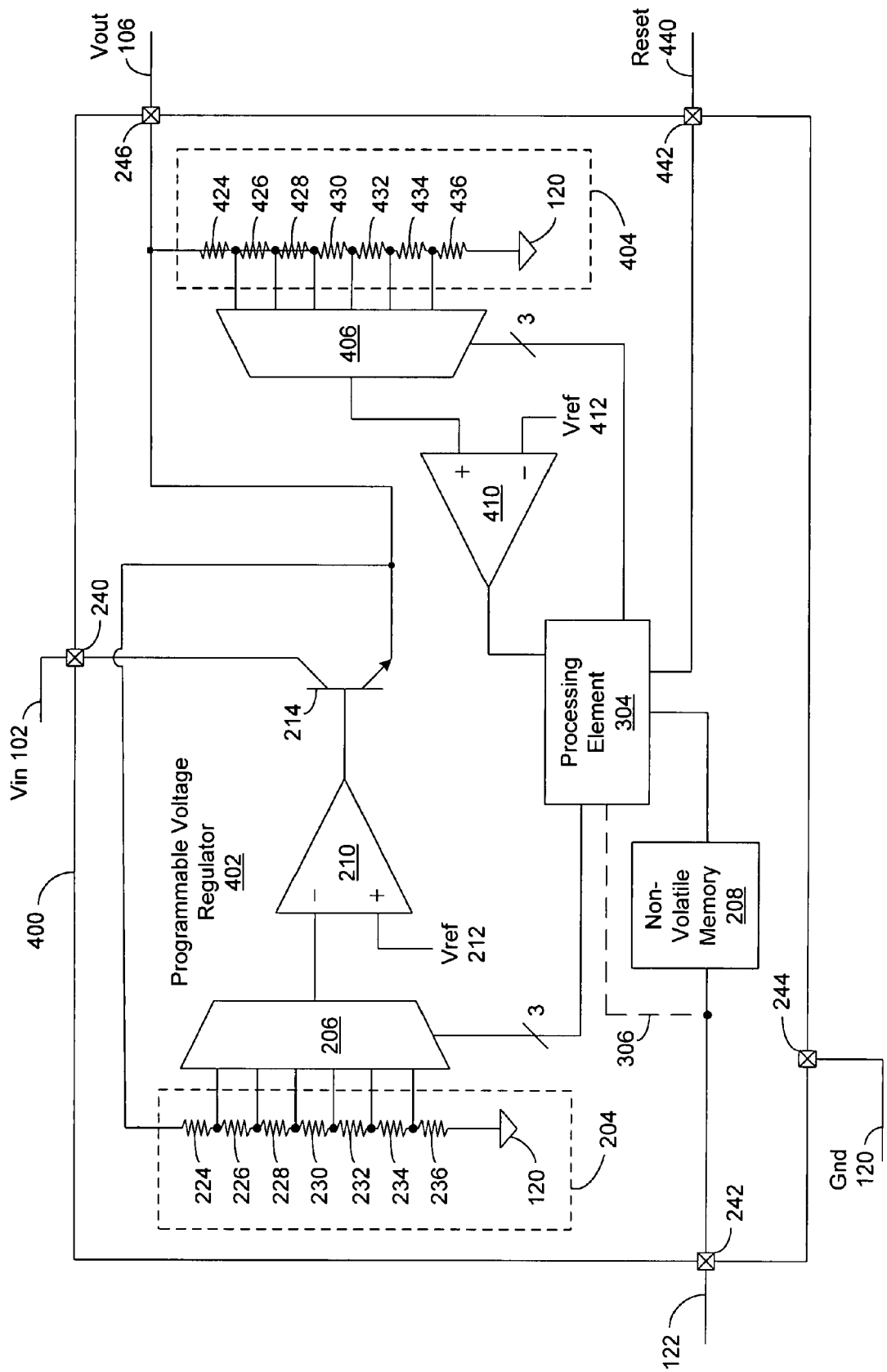
FIG. 4 is a diagram of yet another exemplary programmable voltage regulator circuit in accordance with various embodiments of the invention.

FIG. 4 is a schematic diagram of an exemplary programmable voltage regulator circuit 402 in accordance with various embodiments of the invention. Specifically, the programmable voltage regulator circuit 402 (in an embodiment) can include circuitry for providing a reset function to one or more devices external to the programmable voltage regulator circuit 402. Note that the programmable voltage regulator circuit 402 can be implemented as part of an integrated circuit 400. It is pointed out that the elements of FIG. 4 having the same reference numbers as the elements of any other figure can operate or function in any manner similar to that described herein, but are not limited to such. In an embodiment, the programmable voltage regulator circuit 402 can be an implementation of the programmable voltage regulator module 104 of FIG. 1A or FIG. 1B. The programmable voltage regulator circuit 402 of FIG. 4 can include, but is not limited to, resistor ladder 204, multiplexer 206, processing element 304, non-volatile memory 208, operational amplifier 210, transistor 214, resistor ladder 404, multiplexer 406, and comparator 410. Note that in one embodiment the programming interface 122 can be coupled to the non-volatile memory 208 via the programming interface pin 242. The processing element 304 can be coupled to the non-volatile memory 208 to receive any programming instructions, values and/or data stored by the non-volatile memory 208. In an embodiment, the programming interface 122 and programming interface pin 242 can be coupled to the processing element 304 as indicated by dashed line 306. It is noted that if the processing element 304 is coupled to the programming interface 122, then the processing element 304 can (in one embodiment) receive and manage the storing of any programming instructions, values and/or data within the non-volatile memory 208.

Within the programmable voltage regulator circuit 402, the resistor ladder 404, the multiplexer 406, the comparator 410 can be utilized for the reset functionality while the resistor ladder 204, the multiplexer 206, the operational amplifier 210 can be utilized to produce the output voltage (Vout) 106. As such, the reset functionality can have one reference voltage (e.g., Vref 412) while the output voltage can have its reference voltage (e.g., Vref 212). Note that reference voltages 212 and 412 can be different voltage values or approximately the same voltage values. Note that although reference voltages 212 and 412 can be different voltages, in one embodiment they can both be the same bandgap reference voltage (e.g., 1.2 V). In one embodiment, a reset signal 440 can be asserted based on the reference voltage 412, which can be unrelated to the output voltage 106 that is based on the reference voltage 212.

Within FIG. 4, note that the resistor ladder 404 is coupled to the emitter of transistor 214. The resistor ladder 404 can include multiple taps which can be coupled to multiple inputs of a multiplexer (MUX) 406. The output of the multiplexer 406 can be coupled to one of the inputs (e.g., positive input) of the comparator 410. Additionally, a reference voltage (Vref) 412 can be coupled to the other input (e.g., negative input) of the comparator 410. The processing element 304 can utilize the coupling between it and the multiplexer 406 in order to set or establish the threshold reset reference voltage with the resistor ladder 404. It is noted that the resistor ladder 404 includes multiple resistors (e.g., 424, 426, 428, 430, 432, 434 and 436) that can each have different impedance (or resistance) values, approximately the same impedance (or resistance) values, or any combination thereof. Furthermore, the resistor ladder 404 can include more or less resistors than shown in FIG. 4. The comparator 410 can compare the output voltage received from the multiplexer 406 against the reference voltage 412. If the output voltage received from the multiplexer 406 falls below the reference voltage 412, the comparator 410 outputs a signal to the processing element 304. Upon receipt of the signal from comparator 410, the processing element 304 can output a reset signal 440 to the reset pin 442, which provides a path for outputting the reset signal 440 from integrated circuit 400. In one embodiment, the resistor ladder 404 and multiplexer 406 can operate in any manner similar to the resistor ladder 204 and multiplexer 206 as described herein, but are not limited to such.

For example in one embodiment, in order to have the programmable voltage regulator circuit 402 operate as a 3.0 volt output device, the programmable voltage regulator circuit 402 can be programmed to have a Low Voltage Detection (LVD) voltage (e.g., 2.9 volts). That is, the regulator subsystem (e.g., that can include elements 204, 206, 210, 214, etc.) of the programmable voltage regulator circuit 402 can generate 3.0 volts, but the supervisor subsystem (e.g., that can include elements 404, 406, 410, etc) of circuit 402 can be configured to output a reset 440 whenever output voltage 106 is less than 2.9 volts for any reason. As such, whenever the output voltage 106 is below 2.9 volts, the supervisor subsystem together with the processing element 304 of the programmable voltage regulator circuit 402 can assert the reset signal 440 which can be received by the central processing unit 110 (e.g., FIG. 1A). Additionally in an embodiment, the programmable voltage regulator circuit 402 can be programmed to have a specific power-on reset delay period, e.g., 5 microseconds (μs). Therefore, after the reference voltage level of 2.9 volts is detected by the programmable voltage regulator circuit 402, the reset signal 440 can be generated by the programmable voltage regulator circuit 402 after the elapse of the programmed delay period (e.g., 5 μs). Moreover in an embodiment, the programmable voltage regulator circuit 402 can be programmed to have a glitch rejection period (e.g., 10 μs). As such, if the output voltage 106 drops below the reference voltage level of 2.9 volts (for example) for at least the length of the programmed glitch rejection period (e.g., 10 μs), the programmable voltage regulator circuit 402 can assert the reset signal 440. However, if the output voltage 106 rises above the 2.9 volt reference voltage threshold before the elapse of the programmed glitch rejection period (e.g., 10 μs), the programmable voltage regulator circuit 402 will not assert the reset signal 440. It is pointed out that the reference voltage, power-on delay period, and glitch rejection period of the programmable voltage regulator circuit 402 can be programmed in-field and in system, but is not limited to such. Furthermore, in an embodiment, note that there is no communication from the CPU 116 to the programmable voltage regulator circuit 402. In this embodiment, the programmable voltage regulator circuit 402 is a one way device from the viewpoint of the CPU 116 (or any other device receiving the reset signal 440).

It is understood that the programmable voltage regulator circuit 402 may not include all of the elements illustrated by FIG. 4. Additionally, the programmable voltage regulator circuit 402 can be implemented to include one or more elements not illustrated by FIG. 4.

Figure 5:
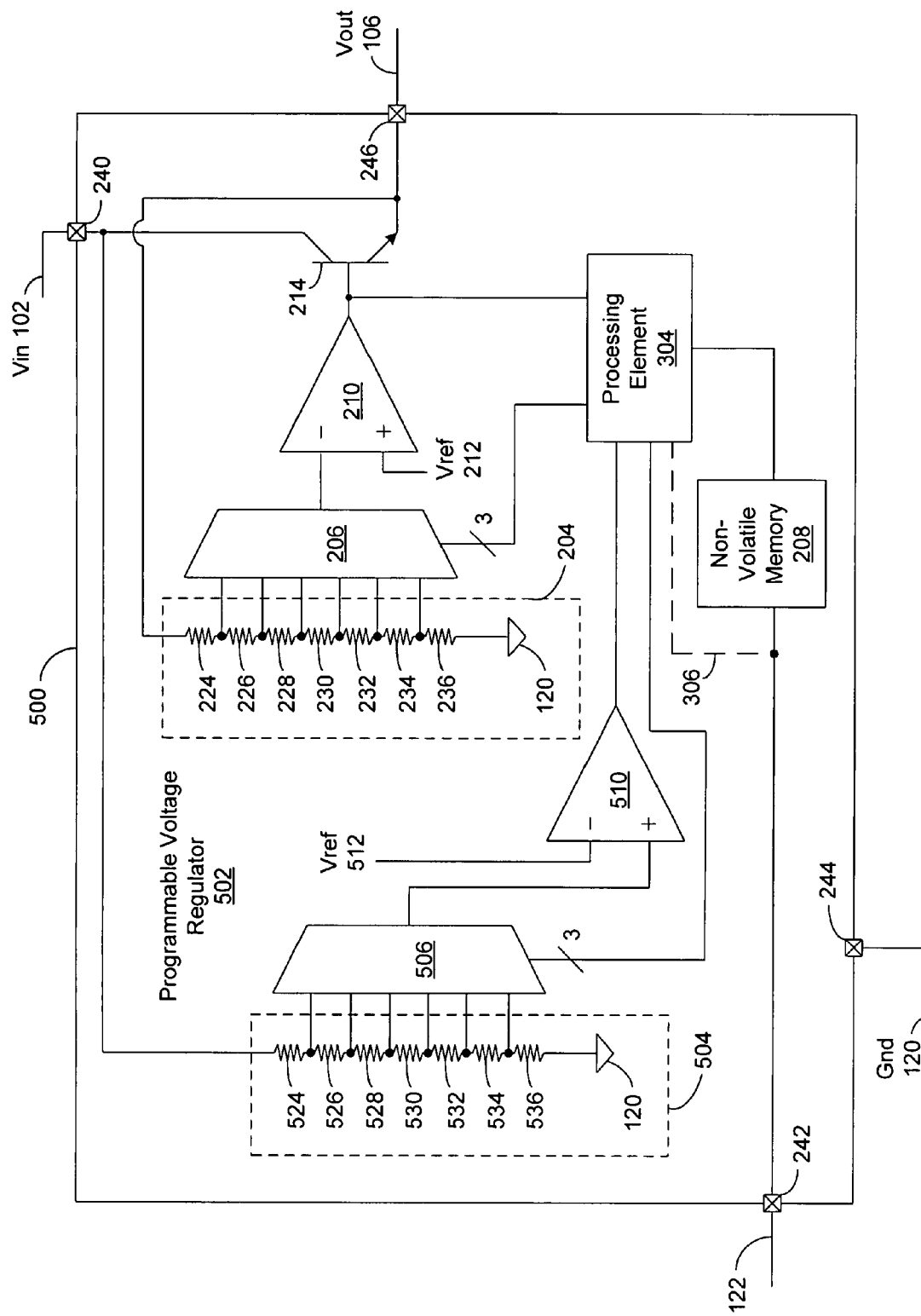
FIG. 5 is a diagram of still another exemplary programmable voltage regulator circuit in accordance with various embodiments of the invention.

FIG. 5 is a schematic diagram of an exemplary programmable voltage regulator circuit 502 in accordance with various embodiments of the invention. Specifically, the programmable voltage regulator circuit 502 (in an embodiment) can include circuitry for providing a "battery protection" functionality for the programmable voltage regulator circuit 502. Note that the programmable voltage regulator circuit 502 can be implemented as part of an integrated circuit 500. It is pointed out that the elements of FIG. 5 having the same reference numbers as the elements of any other figure can operate or function in any manner similar to that described herein, but are not limited to such. In an embodiment, the programmable voltage regulator circuit 502 can be an implementation of the programmable voltage regulator module 104 of FIG. 1A or FIG. 1B. The programmable voltage regulator circuit 502 of FIG. 5 can include, but is not limited to, resistor ladder 204, multiplexer 206, processing element 304, non-volatile memory 208, processing element 304, operational amplifier 210, transistor 214, resistor ladder 504, multiplexer 506, and comparator 510. Note that in one embodiment the programming interface 122 can be coupled to the non-volatile memory 208 via the programming interface pin 242. The processing element 304 can be coupled to the non-volatile memory 208 to receive any programming instructions, values and/or data stored by the non-volatile memory 208. In an embodiment, the programming interface 122 and programming interface pin 242 can be coupled to the processing element 304 as indicated by dashed line 306. It is noted that if the processing element 304 is coupled to the programming interface 122, then the processing element 304 can (in one embodiment) receive and manage the storing of any programming instructions, values and/or data within the non-volatile memory 208.

Within the programmable voltage regulator circuit 502, the resistor ladder 504, the multiplexer 506, and the comparator 510 can be utilized for providing "battery protection" functionality while the resistor ladder 204, the multiplexer 206, and the operational amplifier 210 can be utilized to produce the output voltage (Vout) 106. As such, the battery protection functionality can have one reference voltage (e.g., Vref 512) while the output voltage can have its reference voltage (e.g., Vref 212). Note that reference voltages 212 and 512 can be different voltage values or approximately the same voltage values. In one embodiment, reference voltages 212 and 512 can be the same bandgap reference voltage (e.g., 1.2 V). In one embodiment, the transistor 214 can be turned off based on the reference voltage 512, which can be unrelated to the reference voltage 212 utilized to produce the output voltage 106.

Within FIG. 5, note that the resistor ladder 504 can be coupled to the supply voltage 102. The resistor ladder 504 can include multiple taps which can be coupled to multiple inputs of a multiplexer (MUX) 506. The output of the multiplexer 506 can be coupled to one of the inputs (e.g., positive input) of the comparator 510. Additionally, the reference voltage 512 can be coupled to the other input (e.g., negative input) of the comparator 510. The processing element 304 can utilize the coupling between it and the multiplexer 506 in order to set or establish a minimum threshold battery protection reference voltage with the resistor ladder 504. It is noted that the resistor ladder 504 can include multiple resistors (e.g., 524, 526, 528, 530, 532, 534 and 536) that can each have different impedance (or resistance) values, approximately the same impedance (or resistance) values, or any combination thereof. Furthermore, the resistor ladder 504 can include more or less resistors than shown in FIG. 5. It is noted that the comparator 510 can output a signal (that is received by the processing element 304) if the input voltage 102 goes below the minimum threshold voltage of reference voltage 512. Upon receiving the signal output by the comparator 510, the processing element 304 turns off the transistor 214 which disables the output voltage 106 of the programmable voltage regulator circuit 502. That is, in an embodiment, the transistor 214 is turned off by the processing element 304 any time the input voltage 102 is less than the reference voltage 512. In one embodiment, the resistor ladder 504 and multiplexer 506 can operate in any manner similar to the resistor ladder 204 and multiplexer 206 as described herein, but are not limited to such.

It is understood that the programmable voltage regulator circuit 502 may not include all of the elements illustrated by FIG. 5. Additionally, the programmable voltage regulator circuit 502 can be implemented to include one or more elements not illustrated by FIG. 5.

Figure 6:
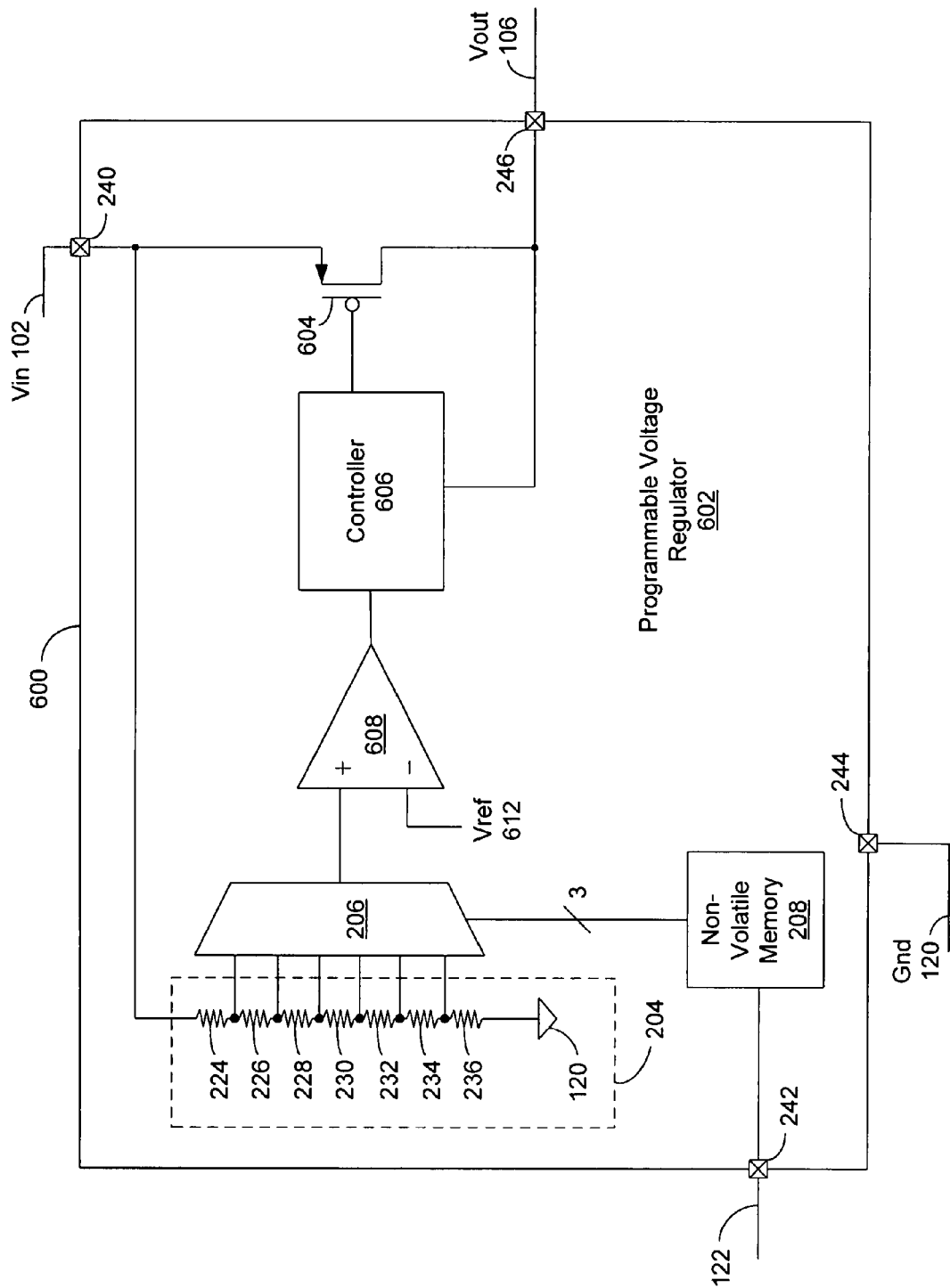
FIG. 6 is a diagram of another exemplary programmable voltage regulator circuit in accordance with various embodiments of the invention.

FIG. 6 is a schematic diagram of an exemplary programmable voltage regulator circuit 602 in accordance with various embodiments of the invention. Specifically, the programmable voltage regulator circuit 602 (in an embodiment) can include circuitry for turning off the output voltage (Vout) 106 until the input voltage 102 has reached an appropriate level. Note that the programmable voltage regulator circuit 602 can be implemented as part of an integrated circuit 600. It is pointed out that the elements of FIG. 6 having the same reference numbers as the elements of any other figure can operate or function in any manner similar to that described herein, but are not limited to such. In an embodiment, the programmable voltage regulator circuit 602 can be an implementation of the programmable voltage regulator module 104 of FIG. 1A or FIG. 1B. The programmable voltage regulator circuit 602 of FIG. 6 can include, but is not limited to, resistor ladder 204, multiplexer 206, non-volatile memory 208, a comparator 608, a controller 606 and a transistor 604. Additionally, the resistor ladder 204 can include multiple resistors (e.g., 224, 226, 228, 230, 232, 234 and 236) that can each have different impedance (or resistance) values, approximately the same impedance (or resistance) values, or any combination thereof. Furthermore, the resistor ladder 204 can include more or less resistors than shown in FIG. 6. Note that a communication interface 122 can be coupled to the non-volatile memory 208.

The voltage supply (Vin) 102 can be coupled to a voltage supply pin 240 of the integrated circuit 600. As such, the voltage supply 102 powers the programmable voltage regulator circuit 602 and can be received by the resistor ladder 204 and the transistor 604. The resistor ladder 204 can include multiple taps which are coupled to multiple inputs of a multiplexer (MUX) 206. The output of the multiplexer 206 can be coupled to one of the inputs (e.g., positive input) of the comparator 608. Additionally, the other input (e.g., negative input) of the comparator 608 can be coupled to a reference voltage (Vref) 612. It is pointed out that the programming interface 122 is coupled to a programming interface pin 242 of the integrated circuit 600, which can be coupled to the non-volatile memory 208. As such, the predetermined operating voltage (e.g., above the desired output voltage 106) of the programmable voltage regulator circuit 602 can be programmed and stored by the non-volatile memory 208. Therefore, the non-volatile memory 208 can utilize the coupling between it and the multiplexer 206 in order to set or establish the predetermined operating voltage with the resistor ladder 204 for producing the output voltage 106 (defined by reference voltage 612).

For example, in an embodiment, when the predetermined operating voltage output by the multiplexer 206 and received by the comparator 608 exceeds the reference voltage 612, the comparator 608 outputs a signal to the controller 606. Upon receiving the signal output by the comparator 608, the controller 606 turns on transistor 604, thereby enabling the output of the desired output voltage 106. It is noted that the controller 606 is coupled to the drain of the transistor 604. As such, the controller 606 is able to maintain a linear feedback system in order to try and maintain the output voltage 106. In an embodiment, the programmable voltage regulator circuit 602 is utilized as a linear regulator.

Within FIG. 6, note that transistor 604 can be implemented in a wide variety of ways. For example, transistor 604 can be implemented as, but is not limited to, a P-channel MOSFET (metal-oxide semiconductor field-effect transistor) which is also known as a PMOS or PFET. Furthermore, transistor 604 can be implemented as, but is not limited to, an N-channel MOSFET which is also known as a NMOS or NFET. Additionally, transistor 604 can be implemented as, but is not limited to, a NPN bipolar junction transistor (BJT) or a PNP bipolar junction transistor (BJT). It is noted that transistor 604 can be referred to as a switching element. Note that when implemented as a BJT, an emitter, a base, and a collector of transistor 604 can each be referred to as a terminal of the transistor. Furthermore, the base of transistor 604 can also be referred to as a control terminal of the transistor. Also, when implemented as a FET, a gate, a drain, and a source of transistor 604 can each be referred to as a terminal of the transistor. Additionally, the gate of transistor 604 can also be referred to as a control terminal of the transistor.

Within FIG. 6, it is understood that the programmable voltage regulator circuit 602 may not include all of the elements illustrated by FIG. 6. Additionally, the programmable voltage regulator circuit 602 can be implemented to include one or more elements not illustrated by FIG. 6.

Figure 7:
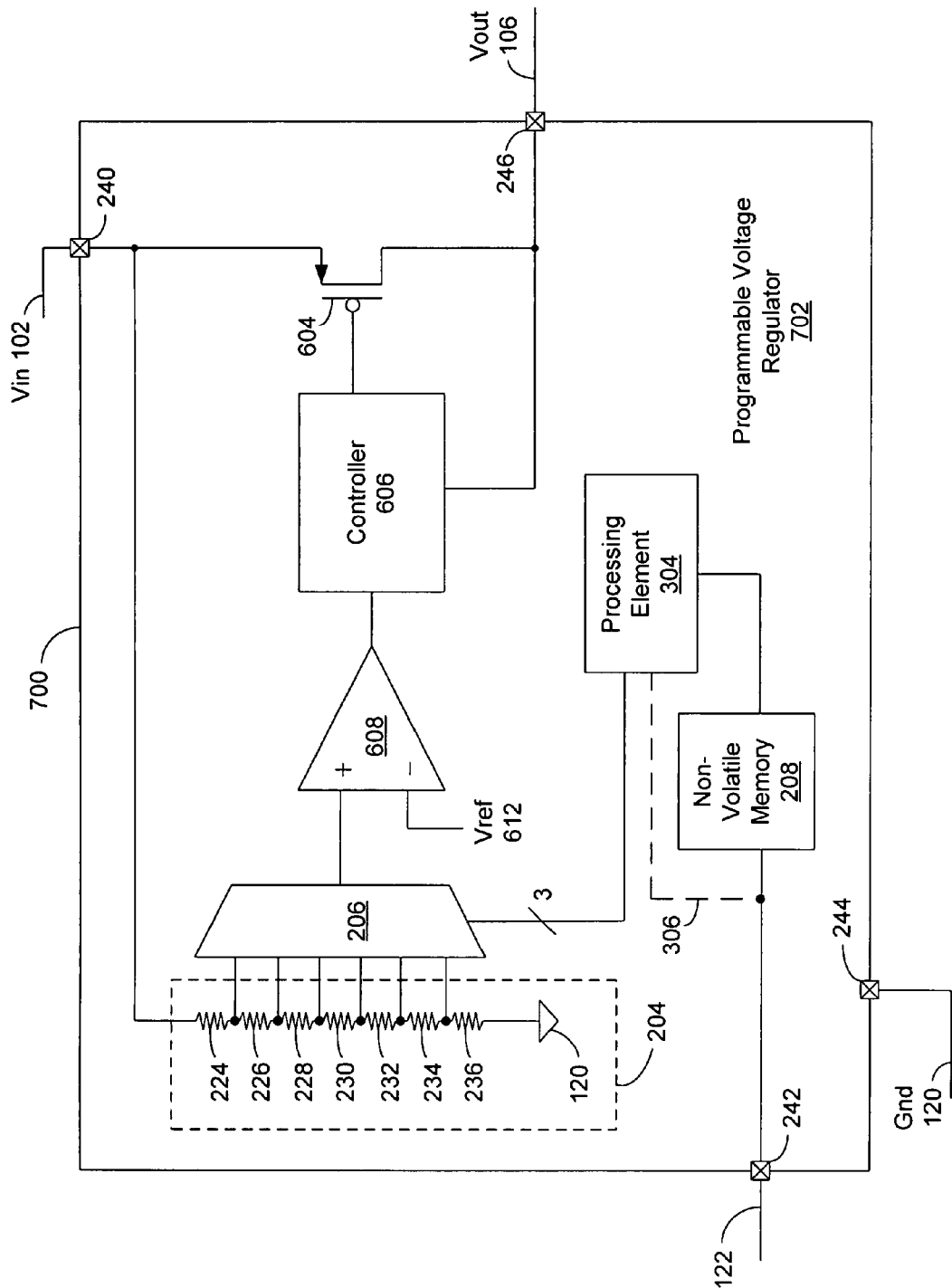
FIG. 7 is a diagram of yet another exemplary programmable voltage regulator circuit in accordance with various embodiments of the invention.

FIG. 7 is a schematic diagram of an exemplary programmable voltage regulator circuit 702 in accordance with various embodiments of the invention. Specifically, the programmable voltage regulator circuit 702 (in an embodiment) can include circuitry for turning off the output voltage (Vout) 106 until the input voltage 102 has reached an appropriate level. Note that the programmable voltage regulator circuit 702 can be implemented as part of an integrated circuit 700. It is pointed out that the elements of FIG. 7 having the same reference numbers as the elements of any other figure can operate or function in any manner similar to that described herein, but are not limited to such. In an embodiment, the programmable voltage regulator circuit 702 can be an implementation of the programmable voltage regulator module 104 of FIG. 1A or FIG. 1B. The programmable voltage regulator circuit 702 of FIG. 7 can include, but is not limited to, resistor ladder 204, multiplexer 206, comparator 608, transistor 604, controller 606, processing element 304, and non-volatile memory 208. Note that in one embodiment the programming interface 122 can be coupled to the non-volatile memory 208 via the programming interface pin 242. The processing element 304 can be coupled to the non-volatile memory 208 to receive any programming instructions, values and/or data stored by the non-volatile memory 208. In an embodiment, the programming interface 122 and programming interface pin 242 can be coupled to the processing element 304 as indicated by dashed line 306.

It is pointed out that the processing element 304 can have access to the non-volatile memory 208. In an embodiment in accordance with the invention, a portion of the non-volatile memory 208 of the programmable voltage regulator circuit 302 can be reserved for one or more configuration states and another portion of the non-volatile memory 208 can utilized for general purpose user non-volatile memory storage.

Within FIG. 7, in one embodiment in accordance with the invention, the programming interface 122 is used to program the programmable voltage regulator 702, but is not used during run time or operation of the programmable voltage regulator 702. In an embodiment, if the non-volatile memory 208 is accessible for a user's general purpose, then the programming interface 122 can be used during the run time or operation of the programmable voltage regulator 702.

It is pointed out that in one embodiment, the programmable voltage regulator 702 operates in a manner similar to that described herein with reference to programmable voltage regulator 602. However, the processing element 304 of the programmable voltage regulator 702 can utilize the coupling between it and the multiplexer 206 in order to set or establish the predetermined operating voltage with the resistor ladder 204 for producing the output voltage 106 (defined by reference voltage 612).

It is understood that the programmable voltage regulator circuit 700 may not include all of the elements illustrated by FIG. 7. Additionally, the programmable voltage regulator circuit 700 can be implemented to include one or more elements not illustrated by FIG. 7.

Figure 8:
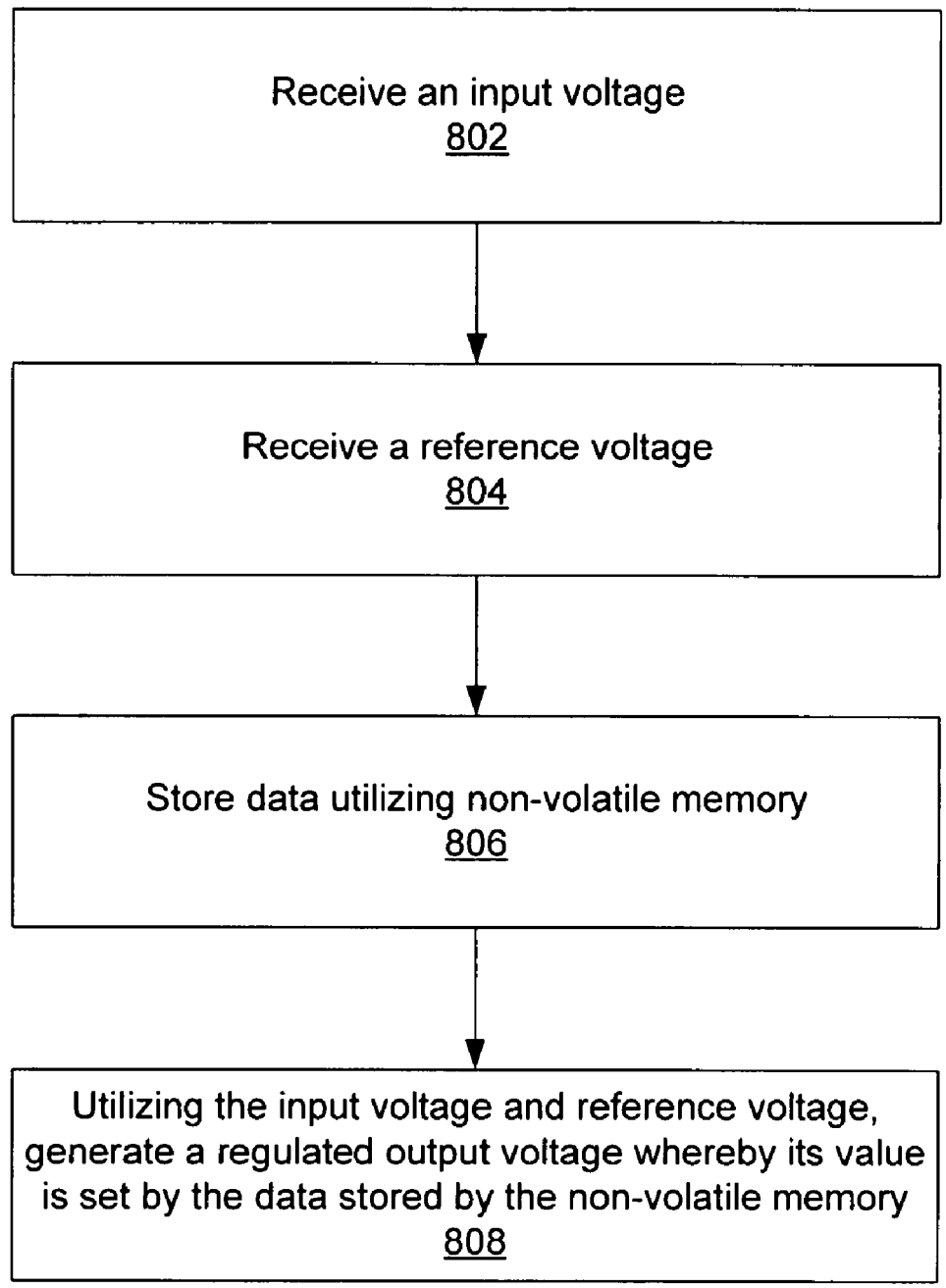
FIG. 8 is a flow diagram of an exemplary method in accordance with various embodiments of the invention.

FIG. 8 is a flow diagram of a method 800 in accordance with various embodiments of the invention for regulating an output voltage. Method 800 includes exemplary processes of various embodiments of the invention which can be carried out by a processor(s) and electrical components under the control of computing device readable and executable instructions (or code), e.g., software. The computing device readable and executable instructions (or code) may reside, for example, in data storage features such as volatile memory, non-volatile memory and/or mass data storage that are usable by a computing device. However, the computing device readable and executable instructions (or code) may reside in any type of computing device readable medium. Although specific operations are disclosed in method 800, such operations are exemplary. Method 800 may not include all of the operations illustrated by FIG. 8. Also, method 800 may include various other operations and/or variations of the operations shown by FIG. 8. Likewise, the sequence of the operations of method 800 can be modified. It is noted that the operations of method 800 can be performed by software, by firmware, by electronic hardware, by electrical hardware, or by any combination thereof.

Specifically, method 800 can include receiving an input voltage. Additionally, a reference voltage can be received. Furthermore, data can be stored utilizing non-volatile memory. Moreover, a regulated output voltage can be generated whereby its value is related to the reference voltage by the data stored by the non-volatile memory. In this manner, an output voltage can be regulated.

At operation 802 of FIG. 8, an input voltage (e.g., Vin 102) can be received. Note that operation 802 can be implemented in a wide variety of ways. For example in one embodiment, at operation 802 the input voltage can be received via one or more pins (e.g., 240) of an integrated circuit (e.g., 200) by a programmable voltage regulator module (e.g., 202 or 602). Operation 802 can be implemented in any manner similar to that described herein, but is not limited to such.

At operation 804, a reference voltage (e.g., Vref 212 or 612) can be received. Operation 804 can be implemented in a wide variety of ways. For example in one embodiment, at operation 804 the reference voltage can be received by the programmable voltage regulator module. Operation 804 can be implemented in any manner similar to that described herein, but is not limited to such.

At operation 806 of FIG. 8, programming instructions, values and/or data can be received and stored utilizing non-volatile memory (e.g., 208). It is pointed out that operation 806 can be implemented in a wide variety of ways. For example in one embodiment, at operation 806 programming instructions, values and/or data can be received and stored by the non-volatile memory via a programming interface (e.g., 122) or a communication bus (e.g., 920), wherein the non-volatile memory can be a component of the programmable voltage regulator module. Operation 806 can be implemented in any manner similar to that described herein, but is not limited to such.

At operation 808, utilizing the input voltage and the reference voltage, a regulated output voltage (e.g., 106) can be generated whereby its value is set by the programming instructions, values and/or data stored by the non-volatile memory. It is noted that operation 808 can be implemented in a wide variety of ways. For example in an embodiment, at operation 808 the programmable voltage regulator module can generate the regulated output voltage, whereby the value of the regulated output voltage is related to the reference voltage by the programming instructions, values and/or data stored by the non-volatile memory. Operation 808 can be implemented in any manner similar to that described herein, but is not limited to such. At the completion of operation 808, process 800 can be exited.

Figure 9:
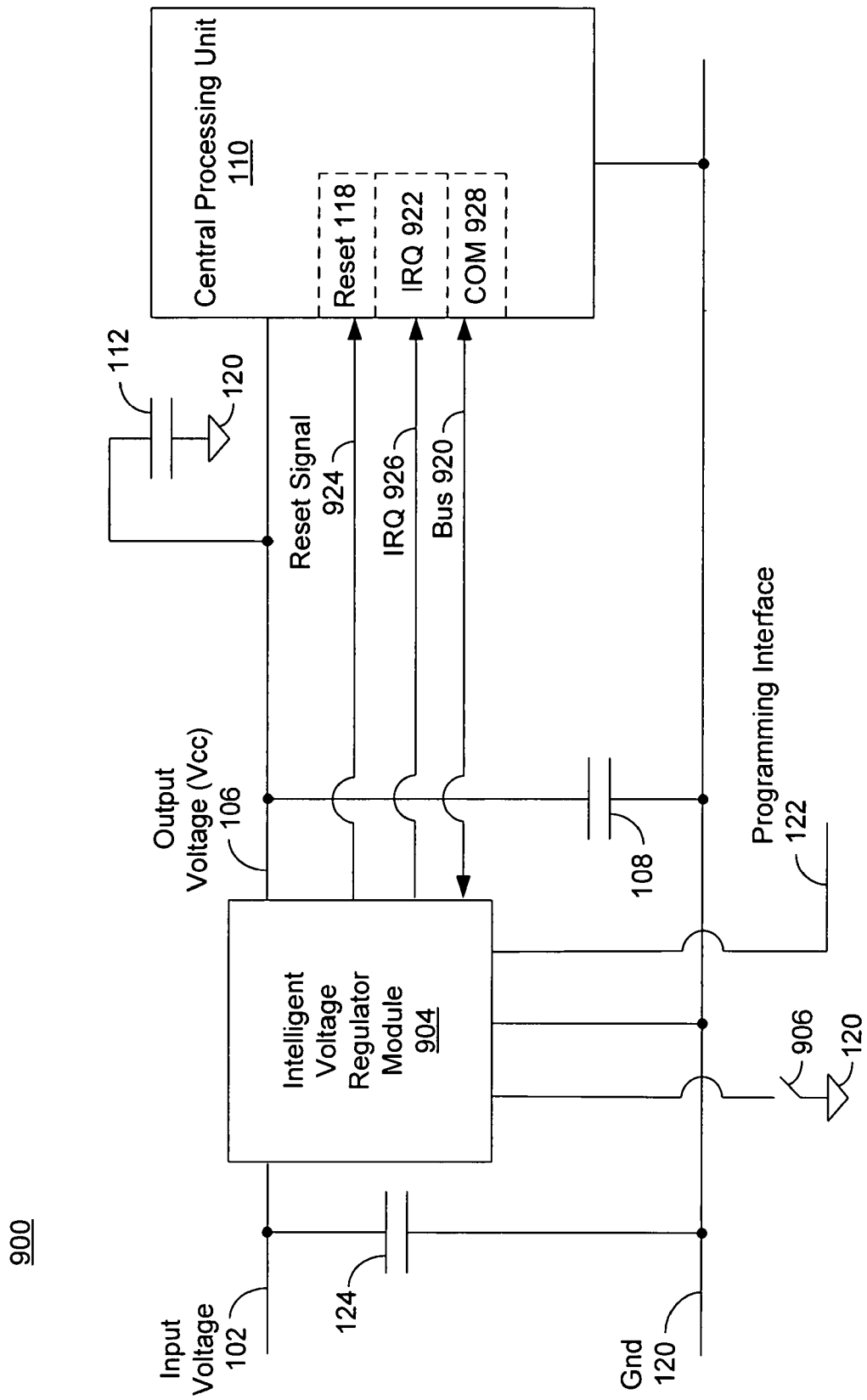
FIG. 9 is a diagram of another exemplary system in accordance with various embodiments of the invention.

FIG. 9 is a diagram of an exemplary system 900 in accordance with various embodiments of the invention. Specifically, in one embodiment, the system 900 can include an intelligent voltage regulator module 904, which can function as a voltage regulator circuit that is intelligent and dynamic. It is pointed out that the elements of system 900 having the same reference numbers as the elements of any other figure can operate or function in any manner similar to that described herein, but are not limited to such. It is noted that the intelligent voltage regulator module 904 can offer programmable reference voltage and also programmable delay, as discussed herein, with the addition of further programmability and intelligent functions. In one embodiment, the intelligent voltage regulator module 904 may be implemented using a mixed signal microcontroller (such as one of the Cypress PSoC family of devices) and therefore may have an integrated processing element (e.g., CPU). Additionally, in an embodiment, the intelligent voltage regulator module 904 may be programmed such that it does not output any voltage until a minimum threshold voltage is detected on its input voltage 102. Additionally, in an embodiment, the intelligent voltage regulator module 904 can detect its output load condition and output if the load is below its operational range (e.g., offer integrated over-load protection). For battery protection, in an embodiment, the intelligent voltage regulator module 904 can shut down if the input voltage 102 drops below a programmable threshold. In "trickle mode" wake up may be from an external interrupt.

In one embodiment, the intelligent voltage regulator module 904 can also offer a dynamic output voltage (Vout) 106 based on the operational state of the system 900. Furthermore, in an embodiment, the intelligent voltage regulator module 904 can have multiple programmable output voltages 106 based on the operation state of the system 900 (e.g., normal, sleep1, sleep2, etc.). It is noted that by lowering the output voltage 106 in response to a sleep condition in one embodiment, the intelligent voltage regulator module 904 can also lower its own bias current during this mode thereby reducing the power consumption of the intelligent voltage regulator module 904 to an ultra-low power quiescent state. Similarly, by reducing the maximum output current of 106 to a low level which is simply enough to supply the rest of the system while in sleep mode (but not in active mode), the intelligent voltage regulator module 904 can also lower its own bias current during this mode thereby reducing the power consumption of the intelligent voltage regulator module 904 to an ultra-low power quiescent state. Note that the communication bus 920 (e.g., serial interface) can be used to notify the intelligent voltage regulator module 904 of the current sleep/operational state of the system 900. It is pointed out that exit from sleep mode can be triggered in one embodiment when the intelligent voltage regulator module 904 detects that the output voltage 106 drops in response to the system 900 waking up.

Within FIG. 9, in an embodiment the intelligent voltage regulator module 904 can also offer a programmable wake up signal that is generated in response to a system event (e.g., a button 906 being pressed, etc.). In one embodiment, clock functionality can also be added to the intelligent voltage regulator module 904 to provide periodic wake up. Furthermore, in an embodiment, the intelligent voltage regulator module 904 can also offer automatic power cycling upon a system crash. For instance, a software error condition, an electrostatic discharge event or other system crash may lock the system 900. Internal watch-dog timers to the intelligent voltage regulator module 904 may provide a power cycle (e.g., hard reset on the supply voltage) in response to the timer expiring. Also, the power cycle may be in response to a command received from the system 900 (e.g., central processing unit 110 via bus 920).

It is pointed out that in one embodiment the intelligent voltage regulator module 904 is intelligent in the sense that it can be reconfigured on-the-fly during its operation. The system 900 can include, but is not limited to, the intelligent voltage regulator module 104, central processing unit (CPU) 110, programming interface 122, and capacitors 108, 112 and 124. Specifically, the intelligent voltage regulator module 104 can include a voltage input 102 and a voltage output 106. The voltage input 102 can be coupled to a first terminal of capacitor 124 while voltage ground 120 can be coupled to a second terminal of capacitor 124. The voltage output 106 of the intelligent voltage regulator module 104 can be coupled to a first terminal of the capacitor 108, a first terminal of the capacitor 112, and a first terminal of the CPU 110. Furthermore, the system 900 can include a voltage ground (Gnd) 120. The voltage ground 120 can be coupled to a third terminal of the intelligent voltage regulator module 104, a second terminal of the capacitor 108, and a second terminal of the CPU 110. A fourth terminal of the intelligent voltage regulator module 104 can be coupled to a reset input 118 of the CPU 110. As such, the intelligent voltage regulator module 104 can output and the CPU 110 can receive the reset signal 924. Moreover, a fifth terminal of the intelligent voltage regulator module 904 can be coupled to an interrupt request (IRQ) controller 922 of the CPU 110. As such, the intelligent voltage regulator module 904 can transmit an interrupt request (IRQ) signal 926 to the CPU 110. Also, a sixth terminal of the intelligent voltage regulator module 904 can be coupled to a communication bus or interface 920, which is coupled to a communication (COM) interface 928 of the CPU 110. As such, the intelligent voltage regulator module 904 can be in communication with the CPU 110. Additionally, the programming interface 122 can be coupled to the intelligent voltage regulator module 904. It is noted that the communication bus 920 can be implemented in a wide variety of ways. For example, the communication bus 920 can be implemented in any manner similar to the programming interface 122 as described herein, but is not limited to such. Note that in an embodiment, the communication bus 920 and the programming interface 122 can be combined into a single interface (e.g., communication bus 920) that can encompass the functionality of both.

It is noted that the system 900 can operate in any manner similar to systems 100, 150 and/or 200, but is not limited to such. However, the intelligent voltage regulator module 904 of the system 900 can include a processing element (e.g., 1004) thereby enabling it to communicate and dynamically change, for example, the output voltage 106 of the intelligent voltage regulator module 904. In one embodiment, a default output voltage can be set within the intelligent voltage regulator module 904 which can be programmed either before assembly or at the test stage of a circuit board assemble. As such, every time the system 900 is powered up, it could default to the default output voltage. However, whenever it came out of reset, the intelligent voltage regulator module 904 can have the option to vary that output voltage dynamically. Furthermore, in an embodiment, the intelligent voltage regulator module 904 can continue to learn from its surroundings. For example, over time the intelligent voltage regulator module 904 might detect that certain type of faults were prevalent around 3.05 V. As such, the intelligent voltage regulator module 904 might decide to learn and determine that for more robust operation, it is going to change its output voltage from (for example) 3.0 V to 3.1 V in order to reduce the risk of the faults prevalent around 3.05 V. In one embodiment, the intelligent voltage regulator module 904 can change its low voltage interrupt trip point from (for example) 3.05 V to 3.25 V.

Within FIG. 9, in one embodiment the intelligent voltage regulator module 904 can potentially be in constant communication with the CPU 110. Specifically, a processing element (e.g., 1004) of the intelligent voltage regulator module 904 can potentially be in constant communication with the CPU 110.

In one embodiment, it is pointed out that system 900 can be implemented such that it will go to sleep and wait for a user to press a button before it wakes up. As such, the system 900 can include a button that is represented by a switch 906. It is noted that a first terminal of the switch 906 can be coupled to the intelligent voltage regulator module 904 while a second terminal of the switch 904 can be coupled to voltage ground 120. In one embodiment, the intelligent voltage regulator module 904 can be implemented with an internal pull-up resistor that is coupled to the first terminal of the switch 906. It is pointed out that the pull up resistor can cause a logic 1 voltage level to be present on the first terminal of switch 906 when the switch 906 is open. As such, when the button is pressed, which can cause the switch 906 to close and the voltage level on the first terminal of switch 906 to enter a logic 0 state, the processing element (e.g., 1004) of the intelligent voltage regulator module 904 can wake up, assert reset signal 924, and coincident with that the intelligent voltage regulator module 904 can start supplying the output voltage 106.

It is understood that the system 900 may not include all of the elements illustrated by FIG. 9. Additionally, the system 900 can be implemented to include one or more elements not illustrated by FIG. 9.

Figure 10:
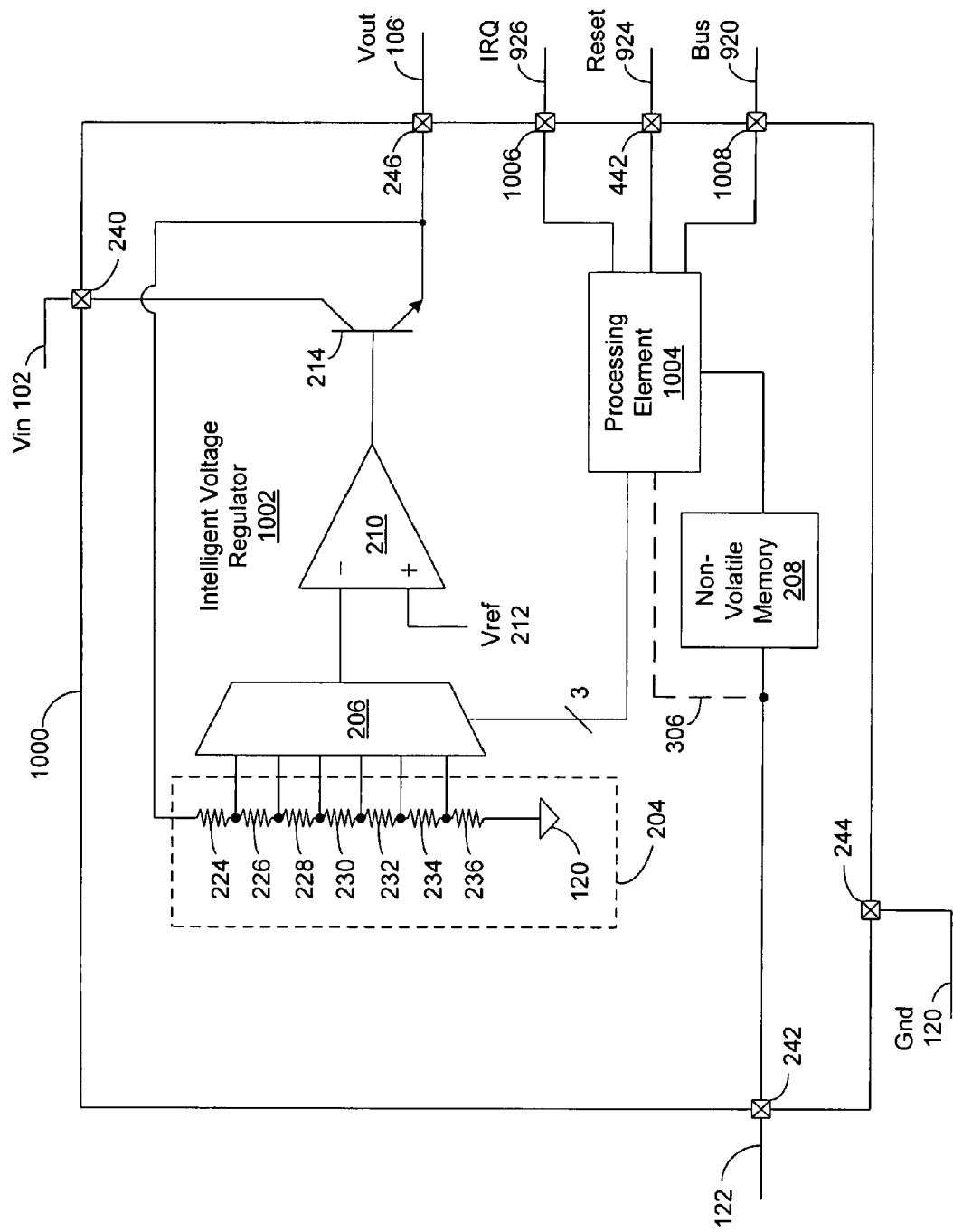
FIG. 10 is a diagram of an exemplary intelligent voltage regulator circuit in accordance with various embodiments of the invention.

FIG. 10 is a schematic diagram of an exemplary intelligent voltage regulator circuit 1002 in accordance with various embodiments of the invention. Note that the intelligent voltage regulator circuit 1002 can be implemented as part of an integrated circuit 1000. It is pointed out that the elements of FIG. 10 having the same reference numbers as the elements of any other figure can operate or function in any manner similar to that described herein, but are not limited to such. In an embodiment, the intelligent voltage regulator circuit 1002 can be an implementation of the intelligent voltage regulator module 904 of FIG. 9. The intelligent voltage regulator circuit 1002 of FIG. 10 can include, but is not limited to, resistor ladder 204, multiplexer 206, transistor 214, processing element 1004, non-volatile memory 208, and operational amplifier 210. It is pointed out that in an embodiment, the combination of the resistor ladder 204, multiplexer 206, operational amplifier 210, and transistor 214 can be referred to as a variable voltage generator, but is not limited to such. Therefore, the resistor ladder 204, multiplexer 206, operational amplifier 210, and transistor 214 are one embodiment of a variable voltage generator. Note that in one embodiment the programming interface 122 can be coupled to the non-volatile memory 208 via the programming interface pin 242 of the integrated circuit 1000. The processing element 1004 can be coupled to the non-volatile memory 208 to receive any programming instructions, values and/or data stored by the non-volatile memory 208. In an embodiment, the programming interface 122 and programming interface pin 242 can be coupled to the processing element 1004 as indicated by dashed line 306. It is noted that if the processing element 1004 is coupled to the programming interface 122, then the processing element 1004 (in one embodiment) can receive and manage the storing of any programming instructions, values and/or data within the non-volatile memory 208. The processing element 1004 can be implemented in a wide variety of ways. For example, the processing element 1004 can include, but is not limited to, a central processing unit, a microprocessor, any type of processing element that can execute instructions, and the like.

The processing element 1004 of the intelligent voltage regulator circuit 1002 can be coupled to a reset pin 442 of the integrated circuit 1000 for outputting a reset signal 924. Also, the processing element 1004 of the intelligent voltage regulator circuit 1002 can be coupled to an interrupt request (IRQ) pin 1006 of the integrated circuit 1000 for outputting an interrupt request signal 926. Furthermore, the processing element 1004 of the intelligent voltage regulator circuit 1002 can be coupled to a communication bus pin 1008 of the integrated circuit 1000 for communicating over the communication bus 920. Note that the communication bus 920 can be implemented in a wide variety of ways. For example, the communication bus 920 can be implemented in any manner similar to the programming interface 122 of FIG. 1A, but is not limited to such.

Within FIG. 10, in one embodiment, during the operation of the processing element 1004 of the intelligent voltage regulator circuit 1002, it is pointed out that the processing element 1004 has the ability to dynamically vary (or change) one or more characteristics (e.g., output voltage, delay period, glitch rejection interval, watch-dog timer, and the like) of the intelligent voltage regulator circuit 1002. It is pointed out that one of the reasons for changing the glitch rejection interval is that the system (e.g., 900) may have different operating modes. For example in one embodiment, the CPU 110 may be controlling a motor and it might experience significant power supply glitching while the motor is running. However, it may not be desirable to set a very large glitch rejection window when the system 900 is not actively driving the motor because that could result in the voltage potentially sinking a long way. So dependent on the activity of the CPU 110, it might be causing noise itself. As such, if the processing element 1004 of the intelligent voltage regulator circuit 1002 knows that it is going to cause noise, the processing element 1004 could make the system 900 more tolerant. In an embodiment, if the processing element 1004 knows that there should not be any noise, it can make the system 900 reset on smaller glitches.

It is understood that the intelligent voltage regulator circuit 1002 may not include all of the elements illustrated by FIG. 10. Additionally, the intelligent voltage regulator circuit 1002 can be implemented to include one or more elements not illustrated by FIG. 10.

Figure 11:
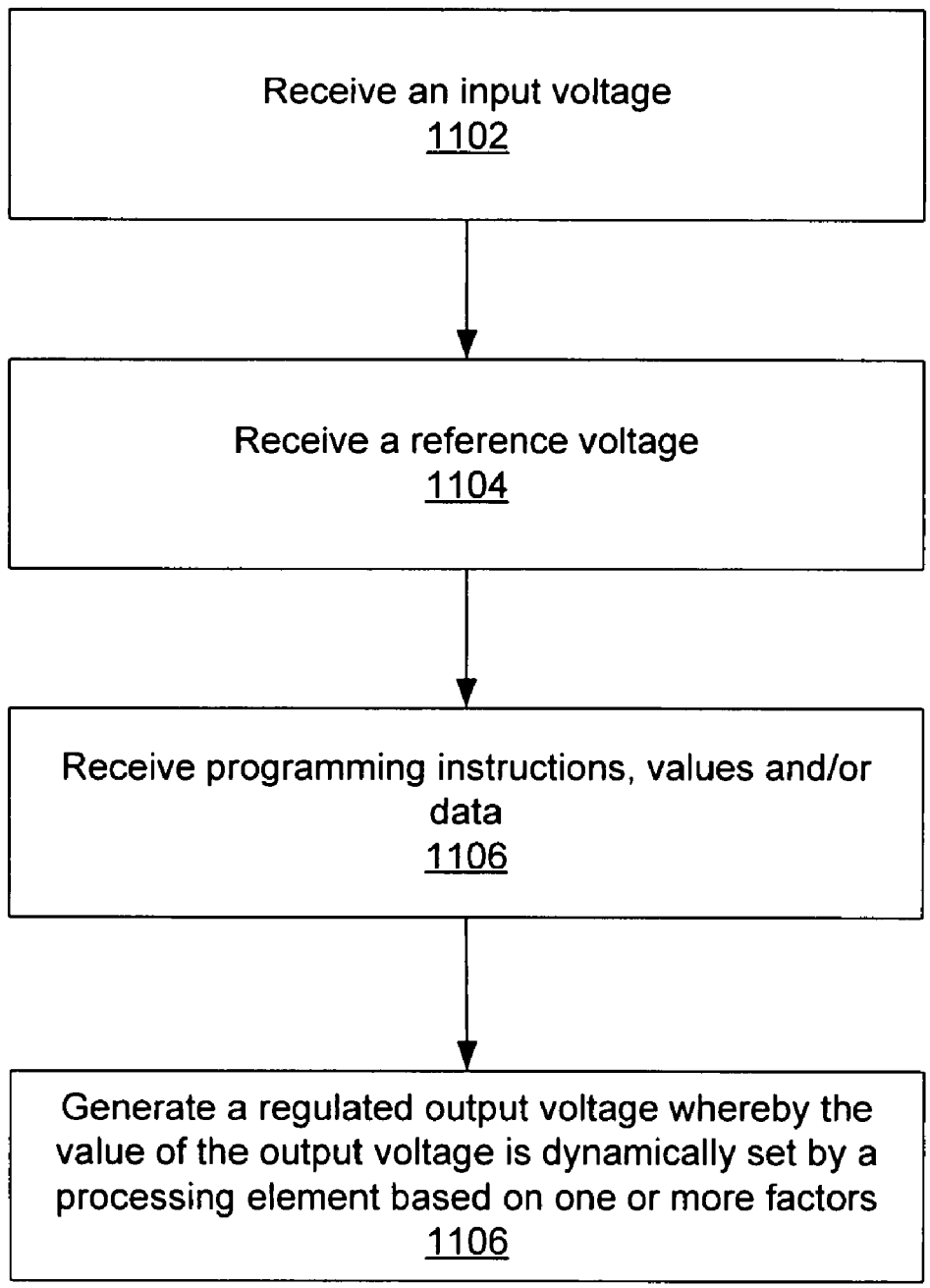
FIG. 11 is a flow diagram of another exemplary method in accordance with various embodiments of the invention.

FIG. 11 is a flow diagram of a method 1100 in accordance with various embodiments of the invention for dynamically regulating an output voltage. Method 1100 includes exemplary processes of various embodiments of the invention which can be carried out by a processor(s) and electrical components under the control of computing device readable and executable instructions (or code), e.g., software. The computing device readable and executable instructions (or code) may reside, for example, in data storage features such as volatile memory, non-volatile memory and/or mass data storage that are usable by a computing device. However, the computing device readable and executable instructions (or code) may reside in any type of computing device readable medium. Although specific operations are disclosed in method 1100, such operations are exemplary. Method 1100 may not include all of the operations illustrated by FIG. 11. Also, method 1100 may include various other operations and/or variations of the operations shown by FIG. 11. Likewise, the sequence of the operations of method 1100 can be modified. It is noted that the operations of method 1100 can be performed by software, by firmware, by electronic hardware, by electrical hardware, or by any combination thereof.

Specifically, method 1100 can include receiving an input voltage. Furthermore, a reference voltage can be received. Moreover, programming instructions, values and/or data can be received. Additionally, a regulated output voltage can be generated whereby its value is dynamically set by a processing element based on one or more factors. In this manner, an output voltage can be dynamically regulated.

At operation 1102 of FIG. 11, an input voltage (e.g., Vin 102) can be received. Note that operation 1102 can be implemented in a wide variety of ways. For example in one embodiment, at operation 1102 the input voltage can be received via one or more pins (e.g., 240) of an integrated circuit (e.g., 200) by a programmable or intelligent voltage regulator module (e.g., 302, 402, 502, 702 or 1002). Operation 1102 can be implemented in any manner similar to that described herein, but is not limited to such.

At operation 1104, a reference voltage (e.g., Vref 212 or 612) can be received. Operation 1104 can be implemented in a wide variety of ways. For example in an embodiment, at operation 1104 the reference voltage can be received by the programmable or intelligent voltage regulator module. Operation 1104 can be implemented in any manner similar to that described herein, but is not limited to such.

At operation 1106 of FIG. 11, programming instructions, values and/or data can be received. It is pointed out that operation 806 can be implemented in a wide variety of ways. For example in one embodiment, at operation 806 programming instructions, values and/or data can be received and stored by non-volatile memory via a programming interface (e.g., 122) or a communication bus (e.g., 920), wherein the non-volatile memory can be a component of the programmable or intelligent voltage regulator module. In an embodiment, at operation 806 programming instructions, values and/or data can be received by a processing element (e.g., 304 or 1004) via a programming interface (e.g., 122) or a communication bus (e.g., 920), wherein the processing element can be a component of the programmable or intelligent voltage regulator module. Operation 1106 can be implemented in any manner similar to that described herein, but is not limited to such.

At operation 1108, a regulated output voltage (e.g., 106) can be generated whereby its value is dynamically set by a processing element (e.g., 304 or 1004) based on one or more factors. It is noted that operation 1108 can be implemented in a wide variety of ways. For example in an embodiment, at operation 1108, the one or more factors can include, but are not limited to, programming instructions, values and/or data stored by non-volatile memory, programming instructions, values and/or data received over a communication bus or programming interface, and/or the state of a switch (e.g., 906). Operation 1108 can be implemented in any manner similar to that described herein, but is not limited to such. At the completion of operation 1108, process 1100 can be exited.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

What is claimed is:

1. A system comprising:
 a circuit including:
 a variable voltage generator coupled to receive an input voltage;
 a non-volatile memory coupled to the variable voltage generator to receive programming to control an output voltage of the variable voltage generator; and
 one or more processing elements configured to provide a multi-bit control value to be used as a selection signal to the variable voltage generator based on the programming, the one or more processing elements comprises a first processing element adapted to receive the programming from a second processing element, wherein the first processing element is adapted to generate a reset signal that is output by the circuit to the second processing element.

2. The system of claim 1, wherein the one or more processing elements is adapted to provide the multi-bit control value as the selection signal to the variable voltage generator to select one of multiple input voltages as an output of the variable voltage generator.

3. The system of claim 2, wherein the non-volatile memory is adapted to receive programming associated with a characteristic of the circuit.

4. The system of claim 3, wherein the first processing element is adapted to receive the programming from the second processing element to dynamically change the characteristic during run time of the circuit.

5. The system of claim 1, wherein the programming sets an output voltage for the circuit.

6. The system of claim 1, wherein the programming sets a delay period implemented by the processing element.

7. The system of claim 1, wherein the programming Usetfisets an output load condition range Uthatfiwithin which the circuit generates an output voltage.

8. The system of claim 4, wherein the first processing element changes the value of a previously programmed output voltage of the circuit.

9. The system of claim 1, wherein the variable voltage generator is further configured to receive a reference voltage.

10. A circuit comprising:
 a variable voltage generator coupled to receive an input voltage;
 a first processing element coupled to the variable voltage generator; and
 a second processing element coupled to the variable voltage generator and the first processing element and adapted to generate programming instructions,
 wherein the first processing element is adapted to receive and execute the programming instructions from the second processing element and to provide to the variable voltage generator a selection signal that selects an output voltage of the variable voltage generator, and
 the first processing element is adapted to generate a reset signal that is output by the circuit to the second processing element.

11. The circuit of claim 10, wherein the selection signal selects the output voltage of the variable voltage generator from one of multiple voltage inputs of the variable voltage generator.

12. The circuit of claim 11, wherein the first processing element is adapted to receive the programming instructions from the second processing element to control a characteristic of the circuit and change the characteristic during operation of the circuit in response to the programming instructions.

13. The circuit of claim 10, wherein the second processing element is adapted to drive switches for one or more of IRQ, reset of the first processing element, and bus.

14. The circuit of claim 10, wherein the variable voltage generator is further configured to receive a reference voltage.

15. A method comprising:
 receiving an input voltage;
 storing a multi-bit value in a non-volatile memory; generating a regulated output voltage for a circuit based on:
 receiving the multi-bit value at a processing element coupled to the non-volatile memory and a variable voltage generator; and providing the multi-bit control value as a selection signal to the variable voltage generator;

receiving with the processing element programming from a second processing element; and generating a reset signal by the processing element that is output by the circuit to the second processing element.

16. The method of claim 15, wherein the processing element provides the multi-bit control value as the selection signal to the variable voltage generator to select one of multiple input voltages as an output of the variable voltage generator.

17. The method of claim 15, wherein the generating of the regulated output voltage comprises receiving with the processing element programming from the second processing element to dynamically change a characteristic of the circuit during run time.

18. The method of claim 17, wherein the programming sets a delay period implemented by the processing element.

19. The method of claim 17, wherein the programming sets an output load condition range within which the circuit generates an output voltage.

20. The circuit of claim 11, wherein the circuit is a programmable linear voltage regulator circuit.

* * * * *

UNITED STATES PATENT AND TRADEMARK OFFICE
CERTIFICATE OF CORRECTION

PATENT NO. : 8,278,978 B1
APPLICATION NO. : 13/283570
DATED : October 2, 2012
INVENTOR(S) : Wright It is certified that error appears in the above-identified patent and that said Letters Patent is hereby corrected as shown below:

Title Page 3, in Field (56), under "OTHER PUBLICATIONS", in Column 1, Line 23, delete "30." and insert -- 30 pages. --, therefor.

In Fig. 11, Sheet 12 of 12, in Box 4, in Line 4, delete Tag "1106" and insert Tag -- 1108 --, therefor.

In Column 20, Lines 23-24, in Claim 7, delete "Usetfisets" and insert -- sets --, therefor.

In Column 20, Line 24, in Claim 7, delete "Uthatfiwithin" and insert -- within --, therefor.

Signed and Sealed this
Nineteenth Day of March, 2013

Teresa Stanek Rea
*Acting Director of the United States Patent and Trademark Office*